(12) United States Patent
Higashitani et al.

(10) Patent No.: US 10,942,304 B2
(45) Date of Patent: Mar. 9, 2021

(54) SOLID-STATE IMAGING ELEMENT, MANUFACTURING METHOD OF THE SAME, AND ELECTRONIC DEVICE

(71) Applicant: SONY CORPORATION, Tokyo (JP)

(72) Inventors: Ami Higashitani, Kumamoto (JP); Nobuyuki Ohba, Kumamoto (JP); Yukihiro Sayama, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 251 days.

(21) Appl. No.: 16/073,130

(22) PCT Filed: Jan. 27, 2017

(86) PCT No.: PCT/JP2017/002883
§ 371 (c)(1),
(2) Date: Jul. 26, 2018

(87) PCT Pub. No.: WO2017/138370
PCT Pub. Date: Aug. 17, 2017

(65) Prior Publication Data
US 2019/0041559 A1   Feb. 7, 2019

(30) Foreign Application Priority Data

Feb. 9, 2016   (JP) .............................. JP2016-022327

(51) Int. Cl.
*H04N 9/07*   (2006.01)
*H01L 27/14*   (2006.01)
(Continued)

(52) U.S. Cl.
CPC .............. *G02B 5/201* (2013.01); *G02B 5/20* (2013.01); *G02B 5/207* (2013.01); *G02B 5/208* (2013.01);
(Continued)

(58) Field of Classification Search
CPC ........ H01L 27/14621; H01L 27/14605; H04N 9/04555; H04N 5/35563; G02B 5/205; G02B 5/201; G02B 5/223; G03F 7/0007
(Continued)

(56) References Cited

U.S. PATENT DOCUMENTS

2007/0035653 A1*   2/2007   Hong ..................... H04N 5/335
                                                      348/340
2007/0296843 A1*  12/2007   Kasuga ................. H04N 5/335
                                                      348/294
2008/0297634 A1    12/2008  Uya

FOREIGN PATENT DOCUMENTS

JP     59-210775 A    11/1984
JP     09-205589 A     8/1997
(Continued)

OTHER PUBLICATIONS

International Search Report and Written Opinion of PCT Application No. PCT/JP2017/002883, dated Apr. 25, 2017, 11 pages of ISRWO.

*Primary Examiner* — John A McPherson
(74) *Attorney, Agent, or Firm* — Chip Law Group

(57) ABSTRACT

The present technology relates to a solid-state imaging element, a manufacturing method of the same, and an electronic device that achieve the extension of a dynamic range by making a difference in light-receiving sensitivity between low-sensitivity pixels and high-sensitivity pixels without changing spectral characteristics. The solid-state imaging element includes a pixel array portion in which two kinds of pixels different in light-receiving sensitivity, high-sensitivity pixels and low-sensitivity pixels are arrayed. The low-sensitivity pixels have a gray filter on or under a color filter to decrease light transmission factor in a visible-light
(Continued)

region by a predetermined ratio. The present technology is applicable to solid-state imaging elements and the like, for example.

17 Claims, 17 Drawing Sheets

(51) Int. Cl.
    *G02B 5/20*     (2006.01)
    *H01L 27/146*     (2006.01)
    *H04N 5/355*     (2011.01)
    *H04N 9/04*     (2006.01)

(52) U.S. Cl.
    CPC ............ *H01L 27/14* (2013.01); *H01L 27/146* (2013.01); *H01L 27/14605* (2013.01); *H01L 27/14621* (2013.01); *H01L 27/14623* (2013.01); *H01L 27/14627* (2013.01); *H01L 27/14643* (2013.01); *H04N 5/35563* (2013.01); *H04N 9/04555* (2018.08); *H04N 9/07* (2013.01); *H01L 27/1464* (2013.01)

(58) Field of Classification Search
    USPC ..................................... 430/7; 257/432, 440
    See application file for complete search history.

(56) References Cited

FOREIGN PATENT DOCUMENTS

| | | |
|---|---|---|
| JP | 10-075333 A | 3/1998 |
| JP | 2001-267543 A | 9/2001 |
| JP | 2005-006066 A | 1/2005 |
| JP | 2005-268356 A | 9/2005 |
| JP | 2007-281875 A | 10/2007 |
| JP | 2008-300614 A | 12/2008 |

* cited by examiner

SOLID-STATE IMAGING ELEMENT, MANUFACTURING METHOD OF THE SAME, AND ELECTRONIC DEVICE

CROSS REFERENCE TO RELATED APPLICATIONS

This application is a U.S. National Phase of International Patent Application No. PCT/JP2017/002883 filed on Jan. 27, 2017, which claims priority benefit of Japanese Patent Application No. JP 2016-022327 filed in the Japan Patent Office on Feb. 9, 2016. Each of the above-referenced applications is hereby incorporated herein by reference in its entirety.

TECHNICAL FIELD

The present technology relates to a solid-state imaging element, a manufacturing method of the same, and an electronic device, in particular to a solid-state imaging element, a manufacturing method of the same, and an electronic device that achieve the extension of a dynamic range by making a difference in light-receiving sensitivity between low-sensitivity pixels and high-sensitivity pixels without changing spectral characteristics.

BACKGROUND ART

Solid-state imaging elements such as in-vehicle cameras and monitoring cameras are required to extend a dynamic range to support every scene including tunnel running, for example.

It is difficult to provide a wide dynamic range for a solid-state imaging element with pixels of the same size. Accordingly, there is known a method by which two kinds of pixels different in size are mixed in a pixel array to make a sensitivity difference (for example, refer to Patent Document 1).

In addition, there is a method for extending a dynamic range by which, out of high-sensitivity pixels and low-sensitivity pixels different in size, the low-sensitivity pixels are provided with clear pixels that allows transmission of light in a visible-light region and gray pixels that are decreased in transmission factor by a certain ratio as compared to the clear pixels (for example, refer to Patent Document 2).

CITATION LIST

Patent Documents

Patent Document 1: Japanese Patent Application Laid-Open No. 2005-268356
Patent Document 2: Japanese Patent Application Laid-Open No. 2007-281875

SUMMARY OF THE INVENTION

Problems to be Solved by the Invention

However, according to the method disclosed in Patent Document 2, the color mixture of an optical path from the low-sensitivity pixels to the high-sensitivity pixels becomes deteriorated. In addition, the clear pixels and the gray pixels decrease color reproducibility due to the absence of color information.

The present technology is devised in light of such circumstances. An object of the present technology is to achieve the extension of a dynamic range by making a difference in light-receiving sensitivity between low-sensitivity pixels and high-sensitivity pixels without changing spectral characteristics.

Solutions to Problems

A solid-state imaging element in a first aspect of the present technology includes a pixel array portion in which two kinds of pixels different in light-receiving sensitivity, high-sensitivity pixels and low-sensitivity pixels are arrayed. The low-sensitivity pixels include a gray filter on or under a color filter to decrease light transmission factor in a visible-light region by a predetermined ratio.

A manufacturing method of a solid-state imaging element in a second aspect of the present technology includes forming a gray filter on or under a color filter to decrease light transmission factor in a visible-light region by a predetermined ratio for low-sensitivity pixels of a solid-state imaging element including a pixel array portion in which two kinds of pixels different in light-receiving sensitivity, high-sensitivity pixels and the low-sensitivity pixels are arrayed.

An electronic device in a third aspect of the present technology includes a solid-state imaging element that has a pixel array portion in which two kinds of pixels different in light-receiving sensitivity, high-sensitivity pixels and low-sensitivity pixels are arrayed. The low-sensitivity pixels include a gray filter on or under a color filter to decrease the transmission factor of light in a visible-light region by a predetermined ratio.

In the first to third aspects of the present technology, the pixel array portion has an array of two kinds of pixels different in light-receiving sensitivity, high-sensitivity pixels and low-sensitivity pixels, and the low-sensitivity pixels have a gray filter on or under a color filter to decrease light transmission factor in a visible-light region by a predetermined ratio.

The solid-state imaging element and the electronic device may be independent devices or may be modules to be incorporated into another device.

Effects of the Invention

According to the first to third aspects of the present technology, it is possible to achieve the extension of a dynamic range by making a difference in light-receiving sensitivity between low-sensitivity pixels and high-sensitivity pixels without changing spectral characteristics.

Note that the advantageous effect described herein is not necessarily limited but may be any one of advantageous effects described in the present disclosure.

MODE FOR CARRYING OUT THE INVENTION

Modes for carrying out the present technology (hereinafter, called embodiments) will be described below. Note that the descriptions will be given in the following order:
1. Schematic configuration example of a solid-state imaging element
2. First embodiment (pixel structure including RGB array and gray filter)
3. Second embodiment (pixel structure including RGBC array and gray filter)
4. Third embodiment (pixel structure including RC array and gray filter)
5. Fourth embodiment (pixel structure including C array and gray filter)
6. Examples of application to electronic devices <1. Schematic Configuration Example of a Solid-State Imaging Element>

Figure 1:
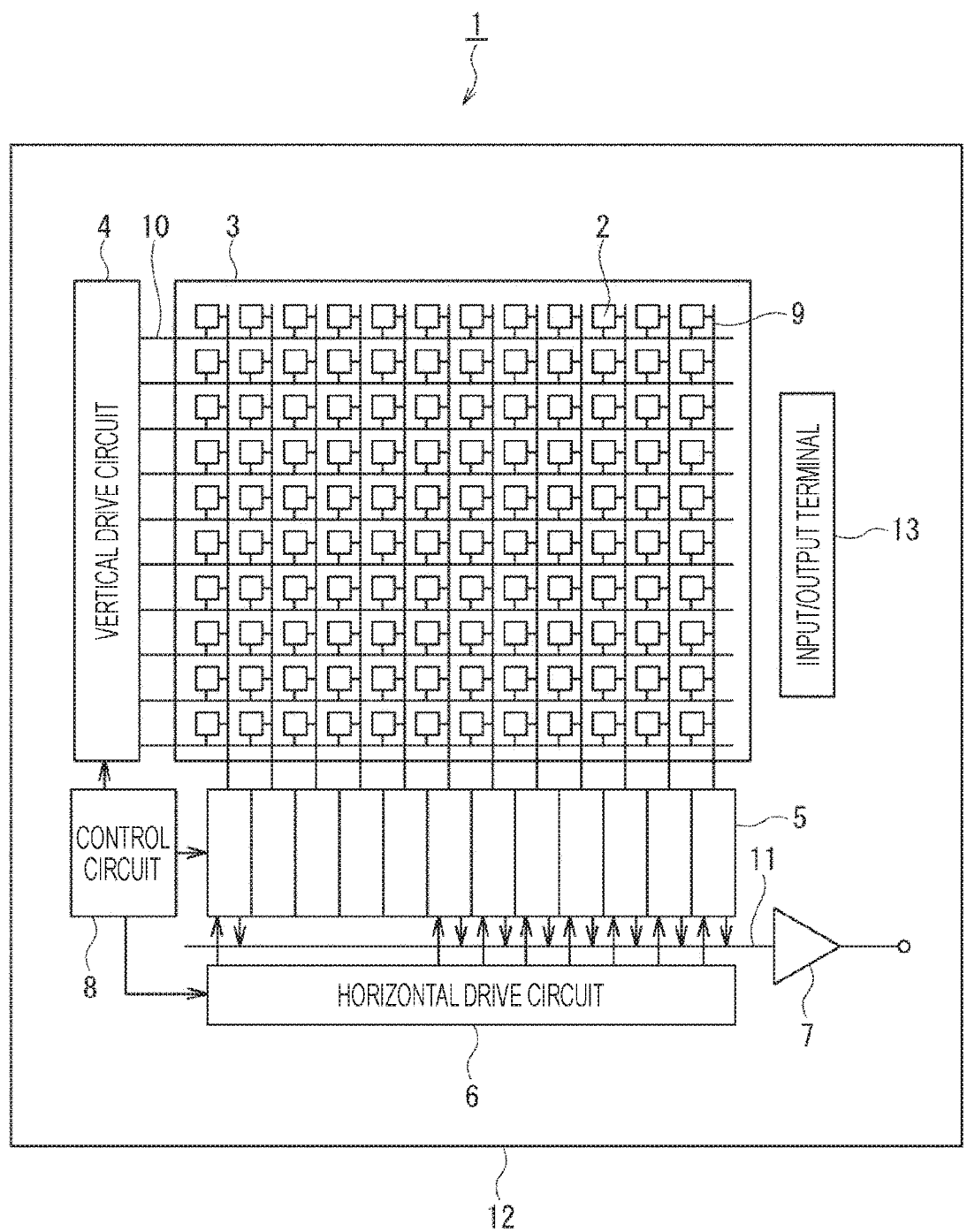
FIG. 1 is a diagram illustrating a schematic configuration of a solid-state imaging device to which the present technology is applied.

FIG. 1 illustrates a schematic configuration of a solid-state element to which the present technology is applied.

A solid-state imaging element 1 illustrated in FIG. 1 is configured such that a semiconductor substrate 12 including silicon (Si) as a semiconductor, for example, has thereon a pixel array portion 3 with a two-dimensional array of pixels 2 and peripheral circuit units surrounding the pixel array portion 3. The peripheral circuit units include a vertical drive circuit 4, column signal processing circuits 5, a horizontal drive circuit 6, an output circuit 7, a control circuit 8, and the like.

Each of the pixels 2 has a photo diode as a photoelectric conversion element and a plurality of pixel transistors. The plurality of pixel transistors includes, for example, four MOS transistors, that is, a transfer transistor, a selection transistor, a reset transistor, and an amplification transistor.

In addition, the pixels 2 may have a shared pixel structure. The shared pixel structure includes a plurality of photo diodes, a plurality of transfer transistors, a shared floating diffusion (floating diffusion region), and one each of other shared pixel transistors. That is, in the shared pixel structure, photo diodes and transfer transistors constituting a plurality of unit pixels share one each of other pixel transistors.

The control circuit 8 receives input clocks and data for ordering an operation mode or the like and outputs data such as internal information regarding the solid-state imaging element 1. Specifically, the control circuit 8 generates clock signals and control signals as references for operations of the vertical drive circuit 4, the column signal processing circuits 5, the horizontal drive circuit 6, and the like, on the basis of vertical synchronization signals, horizontal synchronization signals, and master clocks. Then, the control circuit 8 outputs the generated clock signals and control signals to the vertical drive circuit 4, the column signal processing circuits 5, the horizontal drive circuit 6, and the like.

The vertical drive circuit 4 includes a shift transistor, for example, that selects a predetermined pixel drive wire 10 and supplies a pulse for driving the pixels 2 to the selected pixel drive wire 10 to drive the pixels 2 by row. Specifically, the vertical drive circuit 4 vertically selects and scans the pixels 2 by row in sequence in the pixel array portion 3, and supplies pixel signals based on signal charges generated in accordance with the amount of received light by photoelectric conversion elements of the individual pixels 2 to the column signal processing circuits 5 through vertical signal lines 9.

The column signal processing circuit 5 is arranged for individual columns of the pixels 2 to subject signals output from one row of the pixels 2 to signal processing such as noise reduction from each pixel column. For example, the column signal processing circuits 5 perform signal processing such as correlated double sampling (CDS) for removing pixel-specific fixed pattern noise and AD conversion.

The horizontal drive circuit 6 includes a shift register, for example, that outputs horizontal scan pulses in sequence to select each of the column signal processing circuits 5 in order and causes each of the column signal processing circuits 5 to output pixel signals to a horizontal signal line 11.

The output circuit 7 processes the signals supplied in sequence from each of the column signal processing circuits 5 through the horizontal signal line 11 and outputs the same. The output circuit 7 may perform only buffering or may perform black level adjustment, column variation correction, various digital signal processing operations, and the like, for example. An input/output terminal 13 exchanges signals with the outside.

The thus configured solid-state imaging element 1 is a CMOS image sensor called column AD type in which the column signal processing circuit 5 performing CDS processing and AD conversion processing are arranged for each column of pixels.

The pixel array portion 3 in the solid-state imaging element 1 has two kinds of pixels 2 different in light-receiving sensitivity, high-sensitivity pixels and low-sensitivity pixels, that are arranged two-dimensionally.

2. First Embodiment

A first embodiment of high-sensitivity pixels and low-sensitivity pixels will be described.

<Array Example of High-Sensitivity Pixels and Low-Sensitivity Pixels>

Figure 2:
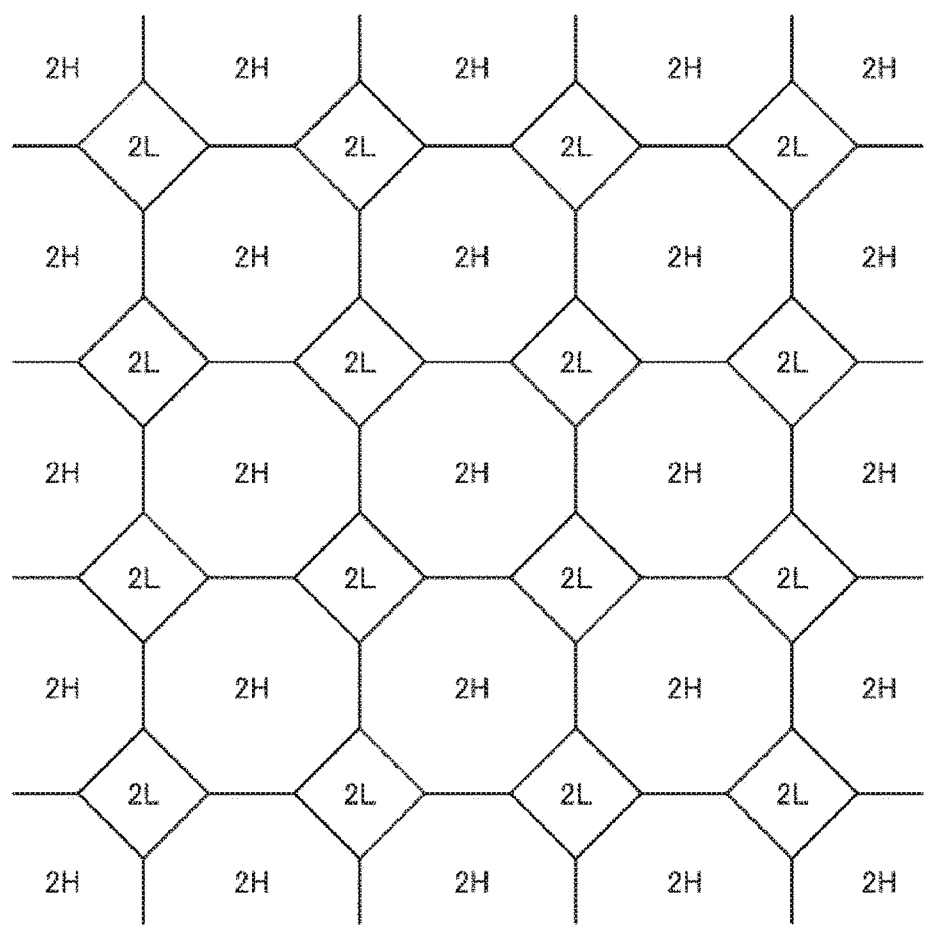
FIG. 2 is a diagram illustrating an array of high-sensitivity pixels and low-sensitivity pixels.

FIG. 2 is a diagram illustrating an array of high-sensitivity pixels 2H and low-sensitivity pixels 2L in the pixel array portion 3.

The high-sensitivity pixels 2H have an octagon plane shape like a square with four corners chamfered and are arrayed in a horizontal direction and vertical direction of the pixel array portion 3.

The low-sensitivity pixels 2L are formed in a plane size (pixel size) smaller than the high-sensitivity pixels in clearances at the four corners of the two-dimensionally arranged high-sensitivity pixels 2H. The low-sensitivity pixels 2L have a rhomboid shape rotated 45 degrees from the almost square high-sensitivity pixels 2H and are arrayed in the horizontal direction and vertical direction of the pixel array portion 3.

The low-sensitivity pixels 2L are smaller in plane size (pixel size) than the high-sensitivity pixels 2H and have a gray filter that decreases light transmission factor in a visible-light region by a predetermined ratio. This makes the low-sensitivity pixels 2L lower in light-receiving sensitivity than the high-sensitivity pixels 2H.

<Array Example of Color Filters>

Figure 3:
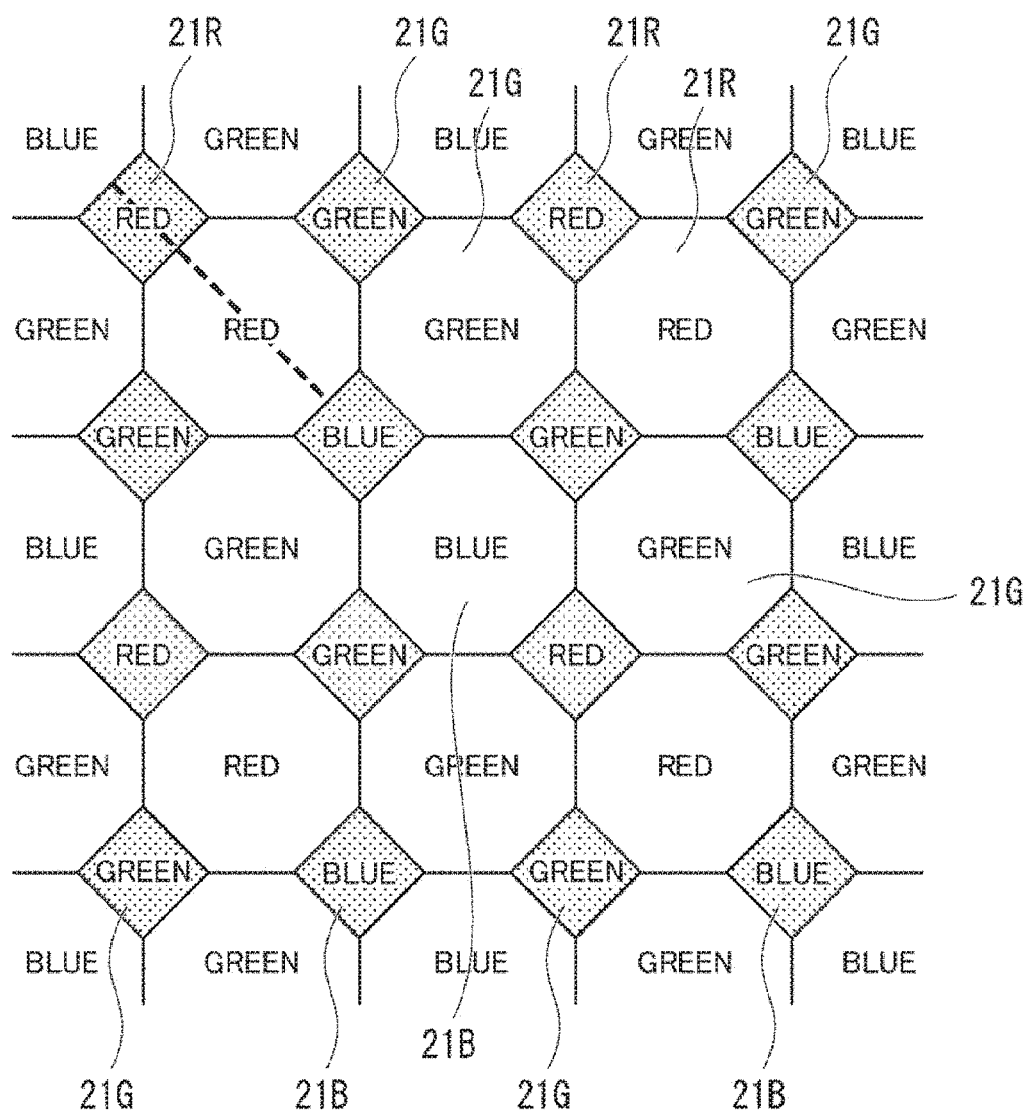
FIG. 3 is a diagram illustrating an array of color filters in a first embodiment.

FIG. 3 is a diagram illustrating an array of color filters formed in the pixels 2 of the pixel array portion 3.

In the pixel array portion 3, the high-sensitivity pixels 2H have a Bayer array of red (R) color filter 21R, green (G) color filter 21G, and blue (B) color filter 21B. In this case, the R color filter 21R is a filter that transmits light in a red wavelength range, the G color filter 21G is a filter that transmits light in a green wavelength range, and the B color filter 21B is a filter that transmits light in a blue wavelength range. Note that in the following description, these color filters will be simply called color filters 21 unless they need to be differentiated among R, G, and B.

In addition, the low-sensitivity pixels 2L also have a Bayer array of the R color filters 21R, the G color filters 21G, and the B color filters 21B.

Therefore, the array of color filters 21 in the two-dimensionally arranged low-sensitivity pixels 2L is identical to the array of color filters 21 in the two-dimensionally arranged high-sensitivity pixels 2H. In other words, referring to FIG. 3, when focus is put on a specific high-sensitivity pixel 2H, the focused high-sensitivity pixel 2H and the low-sensitivity pixel 2L positioned obliquely to the upper left of the former pixel are the same in the color of the color filter 21.

Referring to FIG. 3, shades applied to the low-sensitivity pixels 2L mean that a gray filter 22 (see FIG. 4) is arranged to decrease light transmission factor in a visible-light region by a predetermined ratio. That is, out of high-sensitivity pixels 2H and the low-sensitivity pixels 2L arranged two-dimensionally in the pixel array portion 3, the gray filter 22 is formed only in the low-sensitivity pixels 2L.

<Cross-Sectional View of the High-Sensitivity Pixel and the Low-Sensitivity Pixel>

Figure 4:
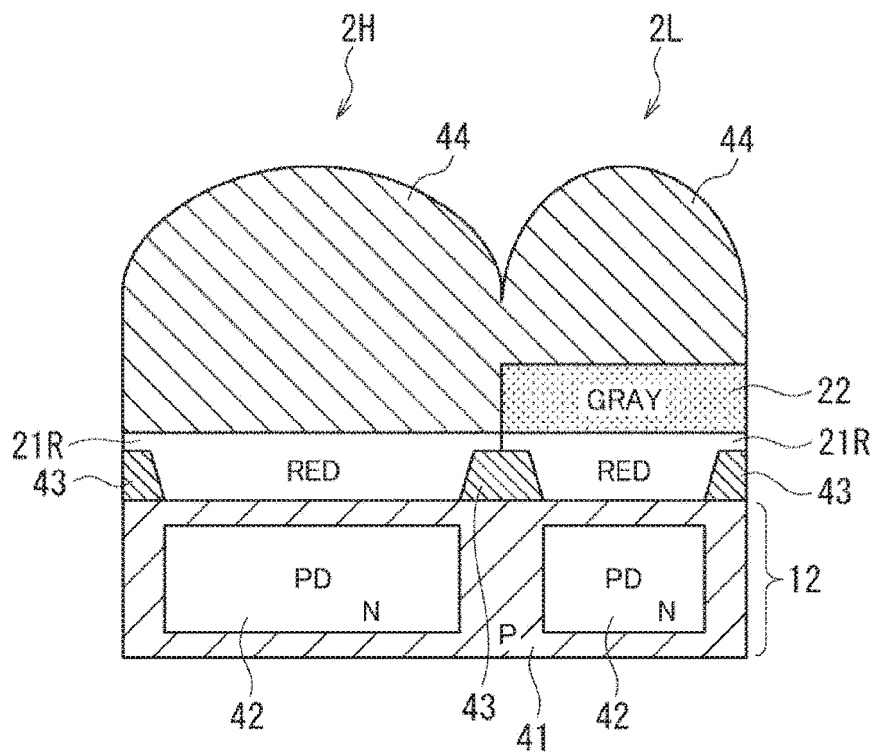
FIG. 4 is a cross-sectional view describing a pixel structure in the first embodiment.

FIG. 4 is a cross-sectional view illustrating a pixel structure of the high-sensitivity pixel and the low-sensitivity pixel.

The cross-sectional view of FIG. 4 is a cross-sectional view of, out of the high-sensitivity pixels 2H and the low-sensitivity pixels 2L, the high-sensitivity pixel 2H and the low-sensitivity pixel 2L having the R color filter 21R indicated by broken lines in FIG. 3, for example.

In the high-sensitivity pixels 2H and the low-sensitivity pixels 2L, a photo diode PD is provided for the individual pixels by forming an N-type (second conductive-type) semiconductor region 42 for each pixel in a P-type (first conductive-type) semiconductor region 41 on the semiconductor substrate 12, for example. The P-type semiconductor region 41 on both the front and back sides of the semiconductor substrate 12 also serves as a hole charge accumulation region for suppress of dark current.

Formed on the front surface of the semiconductor substrate 12 that is indicated on the lower side in FIG. 4 are a plurality of pixel transistors that, for example, reads electric charge accumulated in the photo diodes PD, a plurality of wiring layers, a plurality of inter-layer insulation films, and the like, which are not illustrated in the drawing.

An inter-pixel light-shielding film 43 is formed at boundaries between the pixels on the back surface of the semiconductor substrate 12 that is indicated on the upper side of FIG. 4. The inter-pixel light-shielding film 43 may be made from any light-shielding material but are desirably made from a material that is highly impervious to light and is capable of minute patterning, for example, high-accuracy etching. The inter-pixel light-shielding film 43 can include metallic films of tungsten (W), aluminum (Al), copper (Cu), titanium (Ti), molybdenum (Mo), nickel (Ni), or the like, for example.

In addition, the entire facial layer on the back surface of the semiconductor substrate 12 may have a two-layered antireflection film of hafnium oxide (HfO2) film and silicon oxide film, for example.

The R color filter 21R is formed on the upper surface of the inter-pixel light-shielding film 43 and the upper surface of the semiconductor substrate 12 opened by the inter-pixel light-shielding film 43. The R color filter 21R is formed by spin-coating a light-sensitive resin containing a colorant such as pigment or dye, for example.

In the low-sensitivity pixels 2L, the gray filter 22 is formed on the R color filter 21R and an on-chip lens 44 is formed on the gray filter 22. On the other hand, in the high-sensitivity pixels 2H, the on-chip lens 44 is formed directly on the R color filter 21R.

As described above, the pixel array portion 3 of the solid-state imaging element 1 has the high-sensitivity pixels 2H and the low-sensitivity pixels 2L arranged two-dimensionally, and the low-sensitivity pixels 2L are made smaller in size than the high-sensitivity pixels 2H and have the gray filter 22 that is not formed in the high-sensitivity pixels 2H.

The gray filter 22 is a color filter that decreases light transmission factor in a visible-light region by a predetermined ratio. The gray filter 22 includes a material in which a light-shielding material such as organic pigment, inorganic pigment, or carbon black is dispersed in an organic resin such as acrylic resin, fluorine-based acrylic resin, polystyrene resin, or polyimide resin, for example. Alternatively, the gray filter 22 may include a material in which a light-shielding material such as organic pigment, inorganic pigment, or carbon black is dispersed in a Si group-introduced hybrid resin or inorganic material such as SiN or SiO2.

Figure 5:
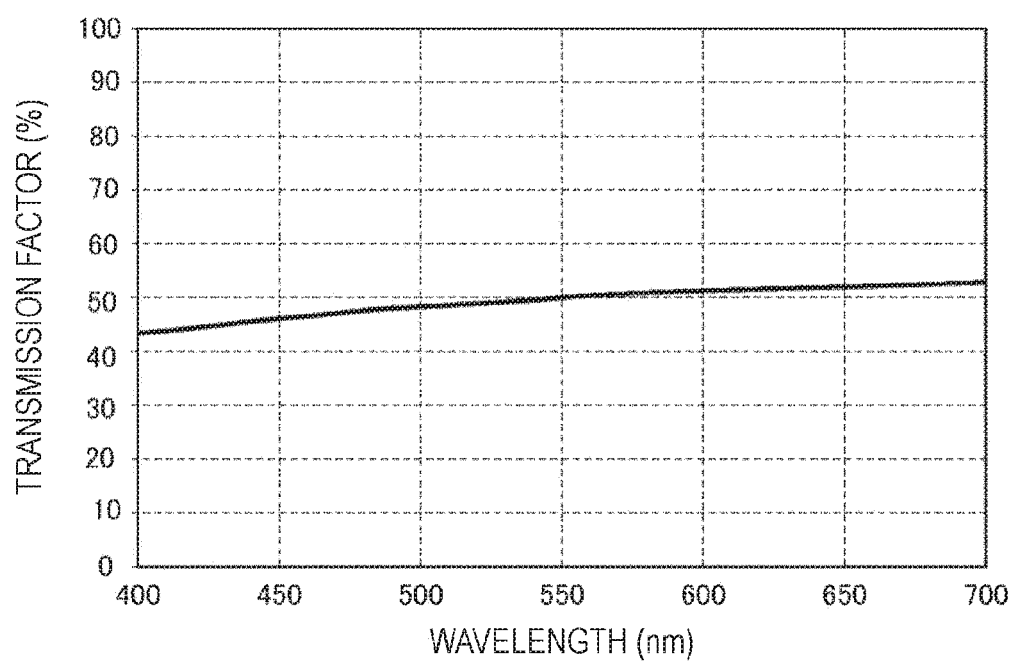
FIG. 5 is a diagram illustrating the transmission factor of a gray filter in which carbon black is dispersed.

FIG. 5 is a graph that indicates transmission factors of the gray filter 22 formed by dispersing carbon black in an organic resin (for example, acrylic resin), in wavelengths of 400 to 700 nm.

Figure 6:
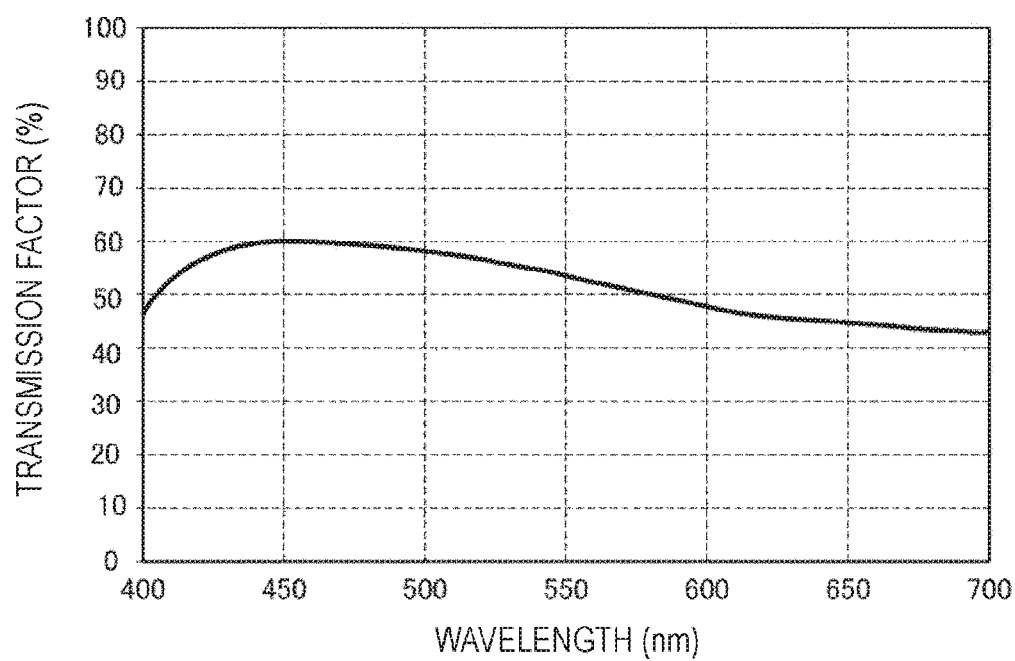
FIG. 6 is a diagram illustrating the transmission factor of a gray filter in which an inorganic pigment is dispersed.

FIG. 6 is a graph that indicates transmission factors of the gray filter 22 formed by dispersing an inorganic pigment (for example, titanium oxide) in an organic resin (for example, acrylic resin), in wavelengths of 400 to 700 nm.

In the example of the gray filter 22 formed by dispersing the organic pigment in the organic resin, the transmission factor is about 50% in the wavelengths of 400 to 700 nm as illustrated in FIG. 5.

In the example of the gray filter 22 formed by dispersing the inorganic pigment in the organic resin, the transmission factor is about 40 to 60% in the wavelengths of 400 to 700 nm as illustrated in FIG. 6.

The gray filter 22 is formed such that the average transmission factor falls within a range of 10 to 90% in the wavelengths of 400 to 700 nm and the transmission factors in the wavelengths of 400 to 700 nm fall within a range of −15 to +15% of the transmission factor in the wavelength of 550 nm. In addition, the light-receiving sensitivity of the low-sensitivity pixels 2L is preferably around 50%, desirably 50% or less of the light-receiving sensitivity of the high-sensitivity pixels 2H.

The film thickness of the gray filter 22 falls within a range of 100 to 1000 nm, for example.

The thus configured solid-state imaging element 1 is an MOS solid-state imaging element of a backside-illuminated type in which light enters the back surface of the semiconductor substrate 12 opposite to the front surface on which the pixel transistors are formed.

The low-sensitivity pixels 2L are simply structured by making the pixel size (plane size) smaller than that of the high-sensitivity pixels 2H and adding the gray filter 22 to decrease light transmission factor in a visible-light region by a predetermined ratio. This makes it possible to control the transmission factor without changing the wavelength dependency of the transmission factor of the R, G, and B color filters 21. Therefore, it is possible to generate pixel signals with a dynamic range extended by making a difference in light-receiving sensitivity between the low-sensitivity pixels 2L and the high-sensitivity pixels 2H without changing spectral characteristics.

In addition, adjusting the film thickness of the gray filter 22 and the content of the light-shielding material makes it easy to increase a difference in light-receiving sensitivity between the high-sensitivity pixels 2H and the low-sensitivity pixels 2L and extend the dynamic range.

<Manufacturing Method of the First Embodiment>

A manufacturing method of the high-sensitivity pixels 2H and the low-sensitivity pixels 2L in the solid-state imaging element 1 illustrated in FIG. 4 will be described with reference to FIGS. 7A, 7B, 7C, and 7D.

Figure 7A:
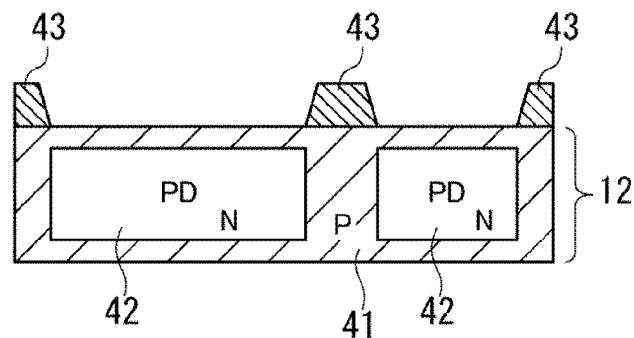
FIGS. 7A, 7B, 7C, and 7D are diagrams illustrating a manufacturing method of a high-sensitivity pixel and a low-sensitivity pixel in the first embodiment.

First, as illustrated in FIG. 7A, the photo diode PD is formed for the individual pixels on the semiconductor substrate 12, and then the inter-pixel light-shielding film 43 is formed at pixel boundaries on the back surface of the semiconductor substrate 12. Note that the plurality of pixel transistors, the plurality of wiring layers, inter-layer insulation films, and the like not illustrated are already formed on the front surface of the semiconductor substrate 12 indicated on the lower side of the drawing.

Figure 7B:
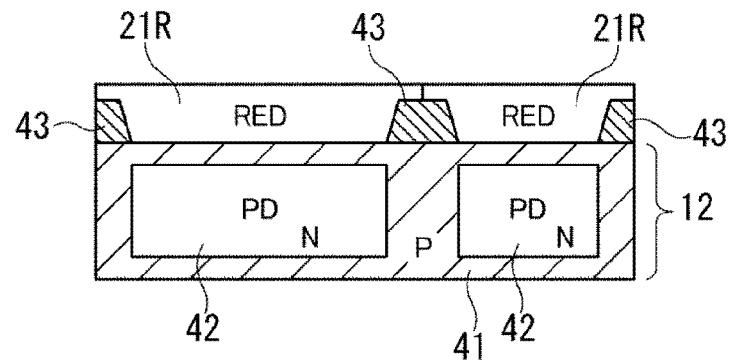

Next, as illustrated in FIG. 7B, a color resist is spin-coated on the upper surface of the inter-pixel light-shielding film 43 and on the upper surface of the semiconductor substrate 12 opened by the inter-pixel light-shielding film 43 and is pattern-processed by photolithography to form the R color filter 21R with a predetermined film thickness. In the example of FIGS. 7A, 7B, 7C, and 7D, only the R color filter 21R is illustrated. However, as described above with reference to FIG. 3, in the entire pixel array portion 3, the R color filter 21R, the G color filter 21G, and the B color filter 21B are formed in a Bayer array in the high-sensitivity pixels 2H and the low-sensitivity pixels 2L.

Figure 7C:
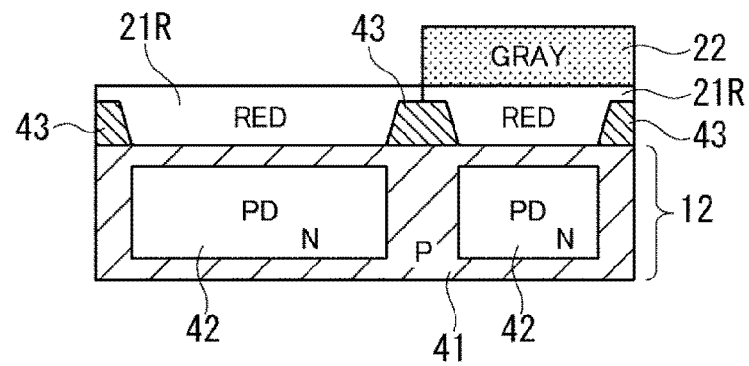

Next, as illustrated in FIG. 7C, the gray filter 22 is formed on the color filters 21 (the R color filter 21R in FIGS. 7A, 7B, 7C, and 7D) of the low-sensitivity pixels 2L. The gray filter 22 can be formed by photolithography or dry etching.

Figure 7D:
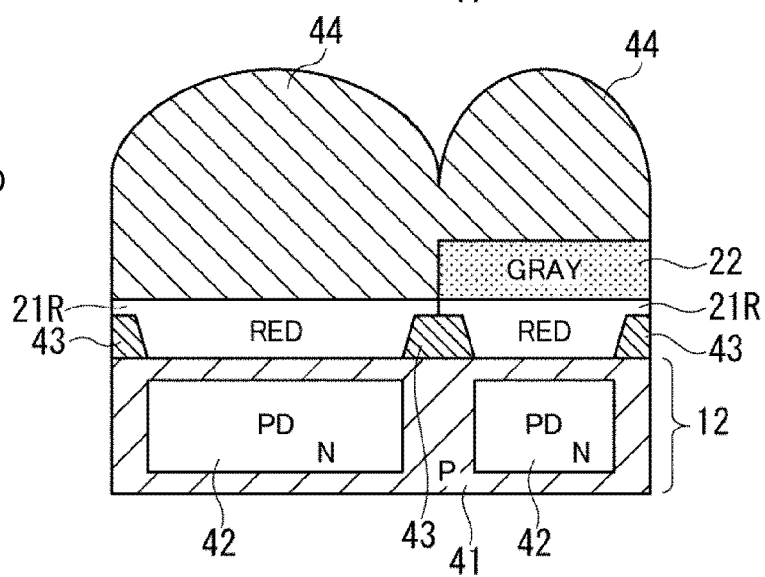

Finally, as illustrated in FIG. 7D, the on-chip lens 44 is formed on the high-sensitivity pixels 2H and the low-sensitivity pixels 2L at the same height. The on-chip lens 44 can be formed by patterning a light-sensitive resin material by photolithography and then deforming the material to a lens shape by a reflow process, for example.

The solid-state imaging element 1 is completed by the foregoing processing. The low-sensitivity pixels 2L are structured such that the one gray filter 22 is added to the high-sensitivity pixels 2H and thus the manufacturing method can be simplified.

Modification Example of the First Embodiment

Next, a modification example of the first embodiment will be described. Note that in the modification examples described later, the components corresponding to those of the first embodiment will be given the same reference signs and descriptions thereof will be omitted.

First Modification Example

Figure 8:
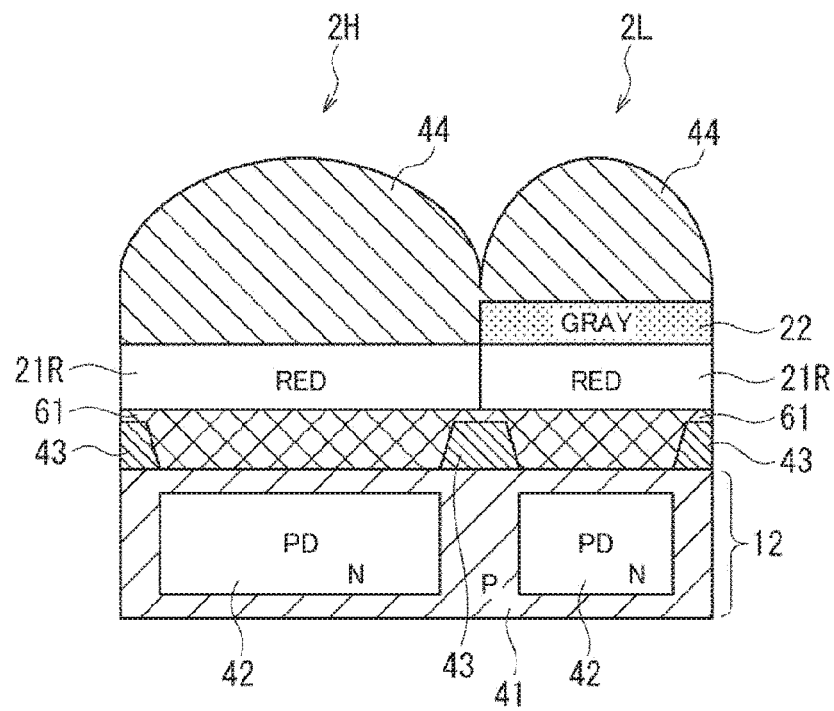
FIG. 8 is a cross-sectional view of a first modification example of the first embodiment.

FIG. 8 is a cross-sectional view of a pixel structure of a high-sensitivity pixel and a low-sensitivity pixel in a first modification example of the first embodiment.

In the first modification example illustrated in FIG. 8, in addition to the configuration of the first embodiment illustrated in FIG. 4, a flattened film 61 is additionally inserted into between the semiconductor substrate 12 and the color filters 21. The flattened film 61 is formed by spin-coating an organic material such as resin, for example. Alternatively, the flattened film 61 may be formed by creating an inorganic film of SiO2, for example, and flattening the same by chemical mechanical polishing (CMP).

Second Modification Example

Figure 9:
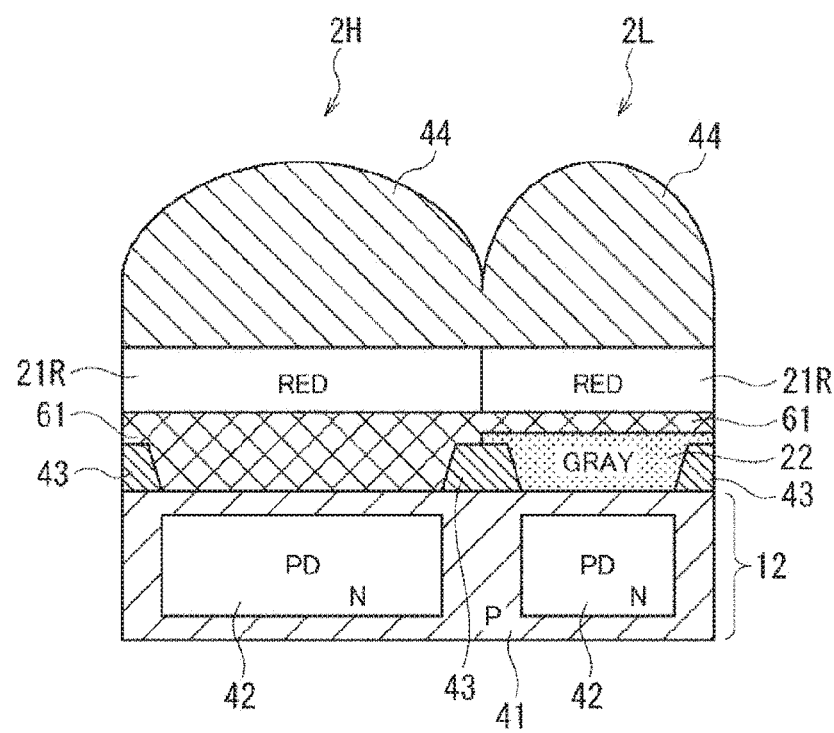
FIG. 9 is a cross-sectional view of a second modification example of the first embodiment.

FIG. 9 is a cross-sectional view of a pixel structure of a high-sensitivity pixel and a low-sensitivity pixel in a second modification example of the first embodiment.

In the second modification example illustrated in FIG. 9, as in the first modification example illustrated in FIG. 8, the flattened film 61 is additionally inserted into between the semiconductor substrate 12 and the color filters 21.

In addition, in the second modification example, the gray filter 22 is formed not on the color filter 21 (the R color filter 21R in FIG. 9) but under the color filter 21 in the low-sensitivity pixel 2L, and part of the flattened film 61 in the high-sensitivity pixel 2H constitutes the color filter 21.

In this way, the gray filter 22 may be formed on the color filters 21 or under the color filters 21 in the low-sensitivity pixels 2L. In addition, a predetermined film such as the flattened film 61 may be inserted into between the color filters 21 and the gray filter 22.

Third Modification Example

Figure 10:
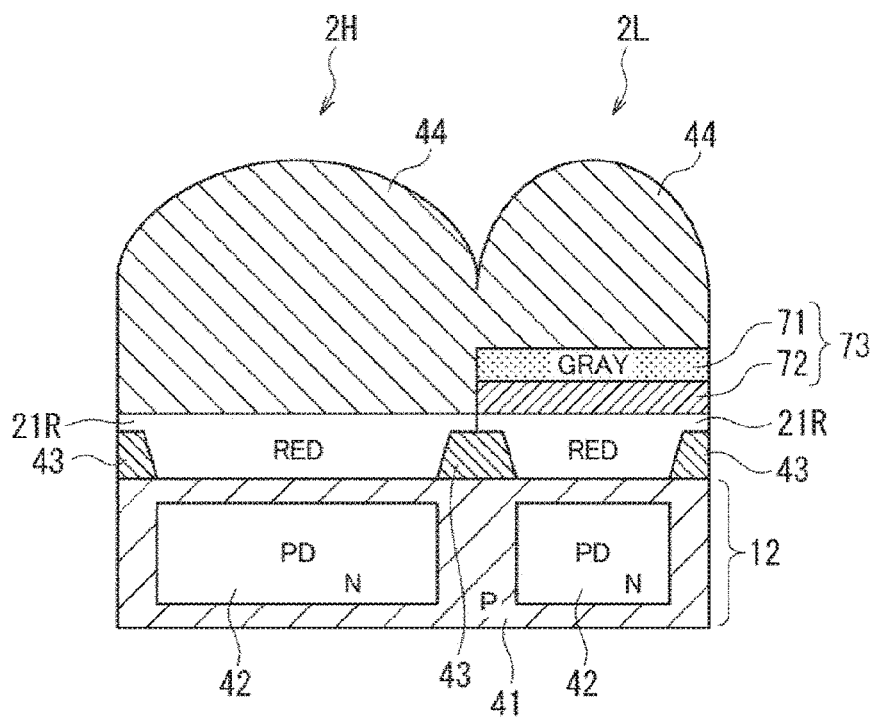
FIG. 10 is a cross-sectional view of a third modification example of the first embodiment.

FIG. 10 is a cross-sectional view of a pixel structure of a high-sensitivity pixel and a low-sensitivity pixel in a third modification example of the first embodiment.

In the first embodiment illustrated in FIG. 4, the gray filter 22 is formed in one layer. While on the other hand, in the third modification example illustrated in FIG. 10, a gray filter 73 is formed in a two-layered structure in which a first film 71 and a second film 72 are layered.

Figure 11:
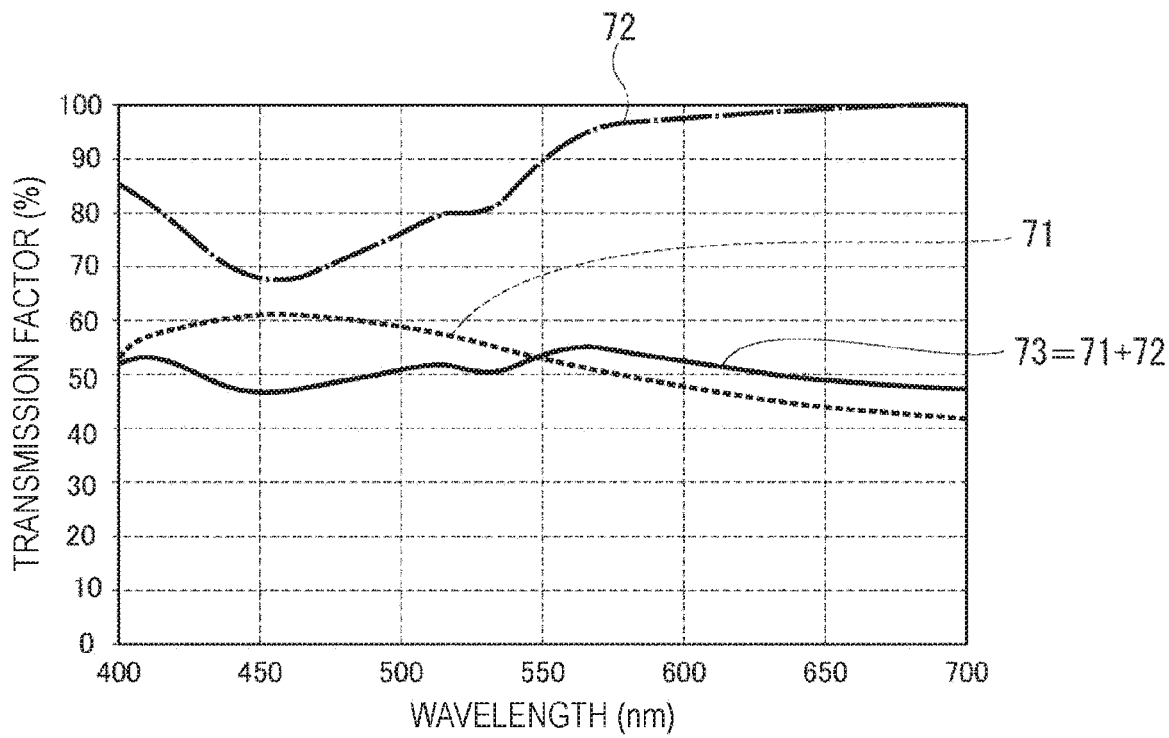
FIG. 11 is a diagram illustrating the transmission factor of a gray filter of a layered structure.

FIG. 11 is a graph that indicates transmission factors of the gray filter 73 formed by layering the first film 71 and the second film 72 in the wavelengths of 400 to 700 nm.

The first film 71 includes the same material as that for the gray filter 22 in the first embodiment illustrated in FIG. 4, for example, and its transmission factors are indicated by a broken line in FIG. 11. The spectral characteristics of the first film 71 are identical to the spectral characteristics illustrated in FIG. 6.

The second film 72 includes the same material as that for the R color filter 21R, for example, and its transmission factors are indicated by an alternate long and short dashed line in FIG. 11.

The transmission factors of the gray filter 73 formed by layering the first film 71 and the second film 72 in the individual wavelengths take on the resultant values of the transmission factors of the first film 71 and the transmission factors of the second film 72, which are indicated by a solid line in FIG. 11.

In this way, the gray filter 73 arranged on or under the color filter 21 in the low-sensitivity pixels 2L can be formed by layering a plurality of kinds of films. Forming the gray filter 73 by layering a plurality of kinds of films provides the spectral characteristics of the gray filter 73 with reduced spectral differences between the long wavelengths and the short wavelengths. In the foregoing example, two kinds of films are layered. Alternatively, three or more kinds of films may be layered.

3. Second Embodiment

Next, a second embodiment of high-sensitivity pixels and low-sensitivity pixels will be described. Note that parts of the second embodiment different from the first embodiment will be described and descriptions of common parts will be omitted as appropriate.

The second embodiment is different from the first embodiment in array of the color filters 21.

<Array Example of Color Filters>

Figure 12:
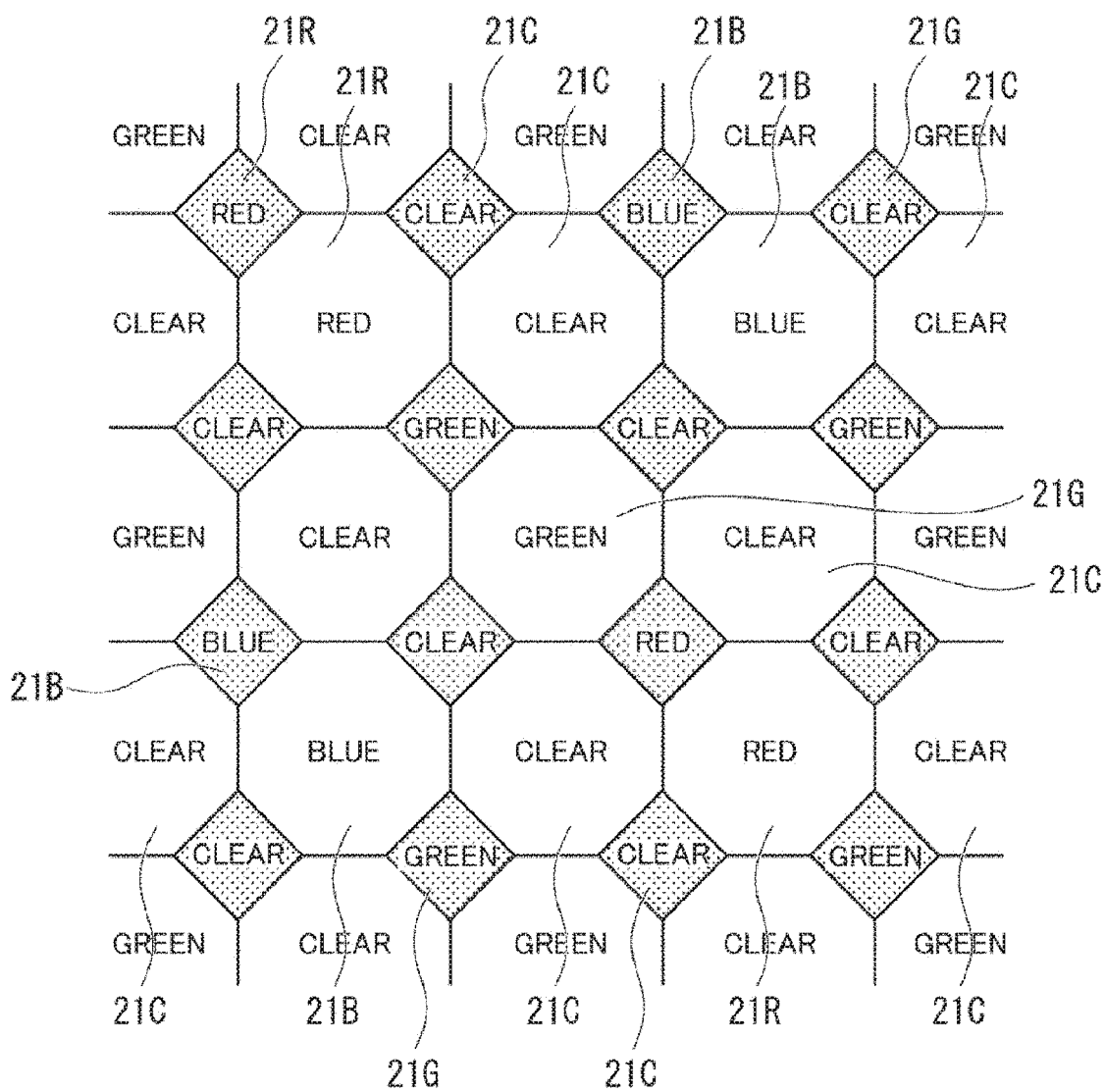
FIG. 12 is a diagram illustrating an array of color filters in a second embodiment.

FIG. 12 is a diagram illustrating an array of color filters in the second embodiment.

In the second embodiment, a clear (C) color filter 21C is added to the R color filter 21R, the G color filter 21G, and the B color filter 21B, and the four kinds of color filters 21 are arrayed under predetermined rules. The C color filter 21C is a filter that transmits light in the entire visible-light area. For example, the C color filter 21C is a filter with an average transmission factor of 90% or more in the wavelengths of 400 to 700 nm.

Also in the second embodiment, the array of the color filters 21 in the two-dimensionally arranged low-sensitivity pixels 2L is identical to the array of the color filters 21 in the two-dimensionally arranged high-sensitivity pixels 2H. In other words, referring to FIG. 12, when focus is put on a specific high-sensitivity pixel 2H, the focused high-sensitivity pixel 2H and the low-sensitivity pixel 2L positioned obliquely to the upper left of the former pixel are the same in the color of the color filter 21.

In addition, as in the first embodiment, the gray filter 22 is arranged in the low-sensitivity pixels 2L to decrease the incident light transmission factor by a predetermined ratio.

4. Third Embodiment

Next, a third embodiment of high-sensitivity pixels and low-sensitivity pixels will be described. Note that parts of the third embodiment different from the first embodiment and the second embodiment will be described and descriptions of common parts will be omitted as appropriate.

The third embodiment is different from the first embodiment in array of the color filters 21.

<Array Example of Color Filters>

Figure 13:
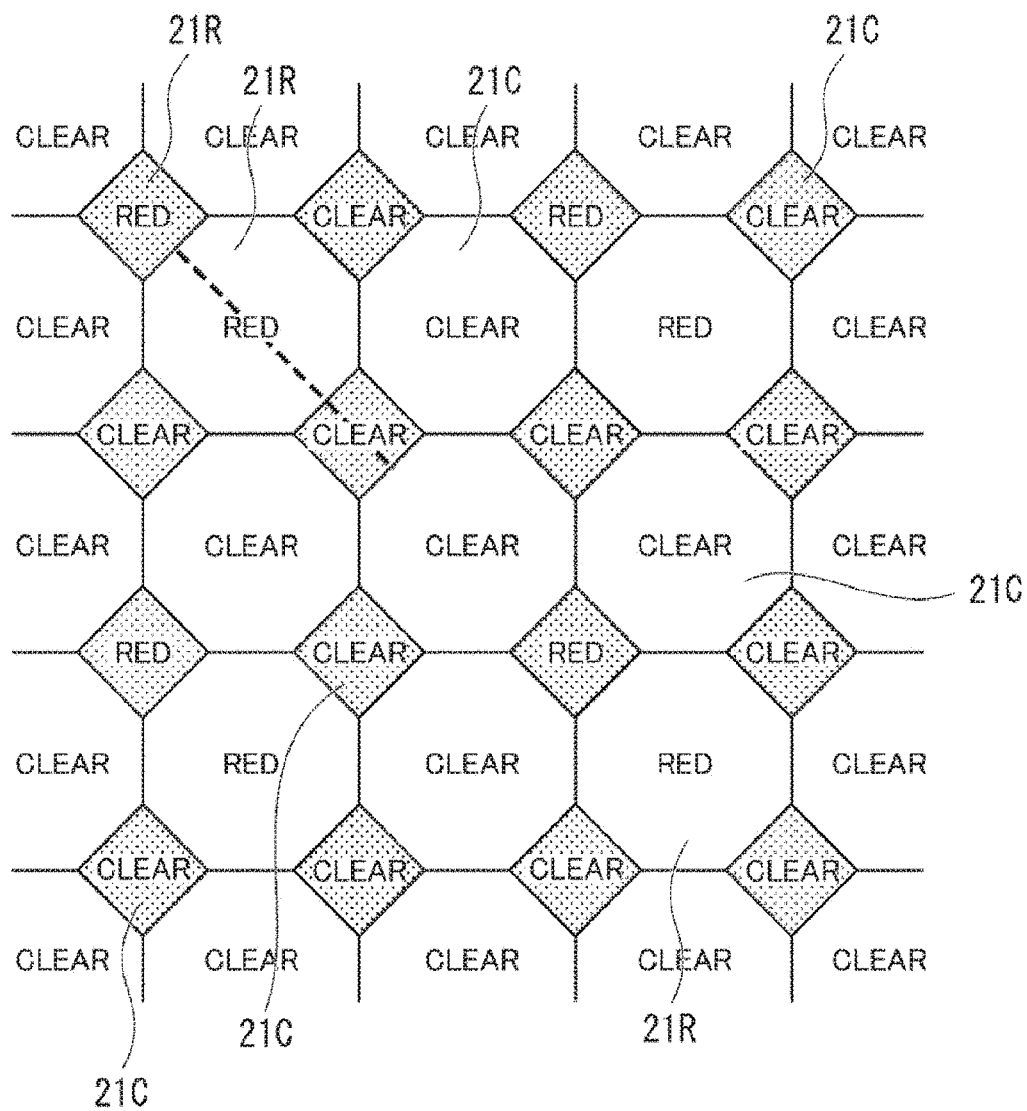
FIG. 13 is a diagram illustrating an array of color filters in a third embodiment.

FIG. 13 is a diagram illustrating an array of color filters in the third embodiment.

In the third embodiment, the two kinds of color filters 21, that is, the R color filter 21R and the C color filter 21C are arrayed under predetermined rules.

The array of color filters 21 in the two-dimensionally arranged low-sensitivity pixels 2L is identical to the array of color filters 21 in the two-dimensionally arranged high-sensitivity pixels 2H. In other words, referring to FIG. 13, when focus is put on a specific high-sensitivity pixel 2H, the focused high-sensitivity pixel 2H and the low-sensitivity pixel 2L positioned obliquely to the upper left of the former pixel are the same in the color of the color filter 21.

In addition, as in the first embodiment, the gray filter 22 is arranged in the low-sensitivity pixels 2L to decrease the incident light transmission factor by a predetermined ratio.

<Cross-Sectional View of the High-Sensitivity Pixel and the Low-Sensitivity Pixel>

<First Pixel Structure>

Figure 14:
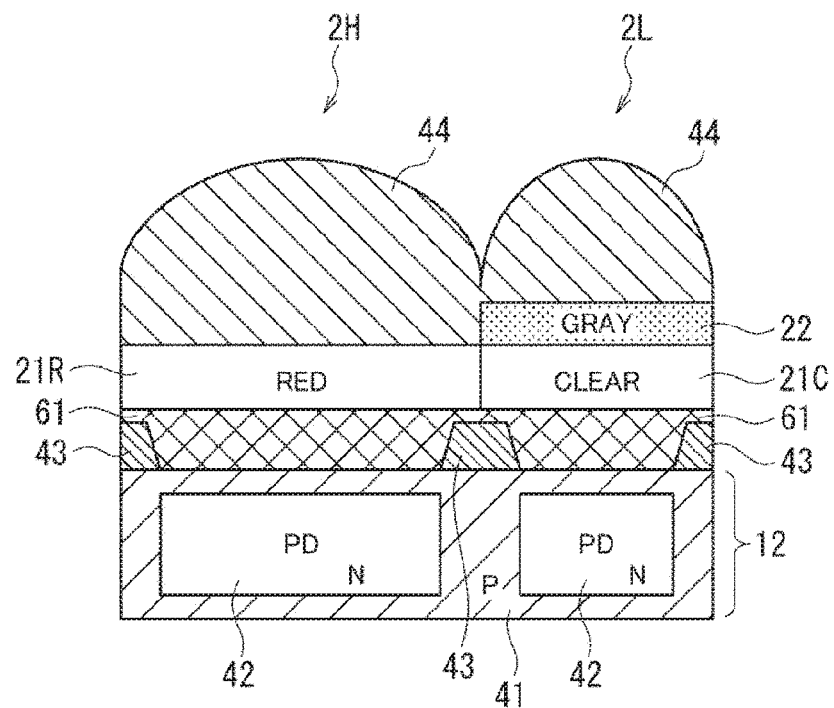
FIG. 14 is a cross-sectional view of a first pixel structure in the third embodiment.

FIG. 14 is a cross-sectional view of a first pixel structure of a high-sensitivity pixel and a low-sensitivity pixel in the third embodiment.

The cross-sectional view of FIG. 14 is a cross-sectional view of, out of the high-sensitivity pixels 2H and the low-sensitivity pixels 2L, the high-sensitivity pixel 2H having the R color filter 21R and the low-sensitivity pixel 2L having the C color filter 21C indicated by a broken line in FIG. 13, for example.

The pixel structure of the high-sensitivity pixel 2H illustrated in FIG. 14 is similar to the pixel structure of the high-sensitivity pixel 2H in the first modification example of the first embodiment described above with reference to FIG. 8.

On the other hand, in the pixel structure of the low-sensitivity pixel 2L illustrated in FIG. 14, the R color filter 21R in the low-sensitivity pixel 2L in the first modification example of the first embodiment described above with reference to FIG. 8 is replaced by the C color filter 21C.

<Second Pixel Structure>

Figure 15:
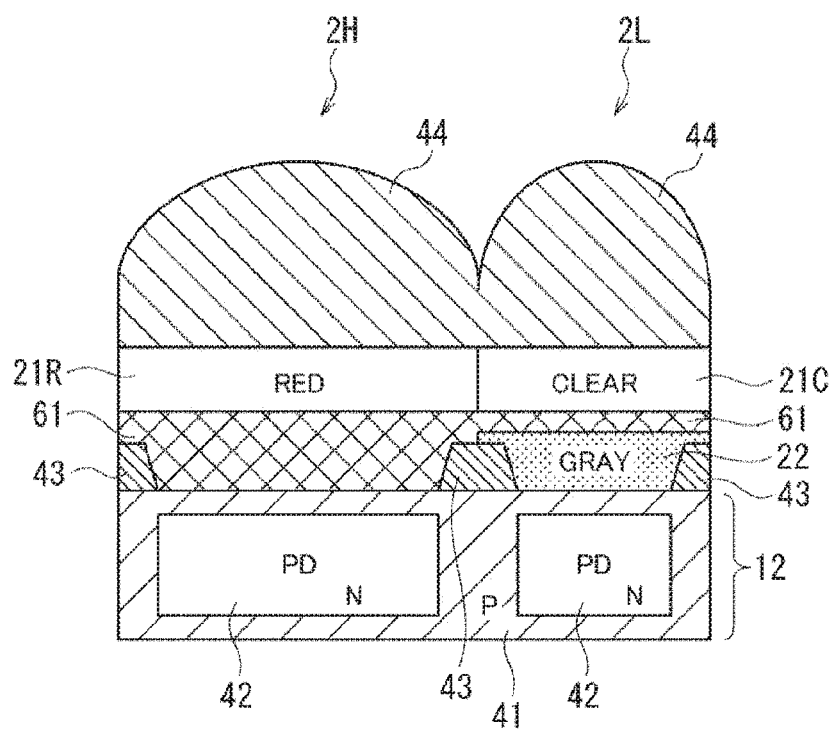
FIG. 15 is a cross-sectional view of a second pixel structure in the third embodiment.

FIG. 15 is a cross-sectional view of a second pixel structure of a high-sensitivity pixel and a low-sensitivity pixel in the third embodiment.

The pixel structure of the high-sensitivity pixel 2H illustrated in FIG. 15 is similar to the pixel structure of the high-sensitivity pixel 2H in the second modification example of the first embodiment described above with reference to FIG. 9.

On the other hand, in the pixel structure of the low-sensitivity pixel 2L illustrated in FIG. 15, the R color filter 21R in the low-sensitivity pixel 2L in the second modification example of the first embodiment described above with reference to FIG. 9 is replaced by the C color filter 21C.

In addition, although not illustrated, the pixel structure illustrated in FIG. 4 without the flattened film 61 and the pixel structure in which the R color filter 21R in the pixel structure of FIG. 10 is replaced by the C color filter 21C described above in relation to the first embodiment can be used as the pixel structure in the second embodiment.

<Third Pixel Structure>

Figure 16:
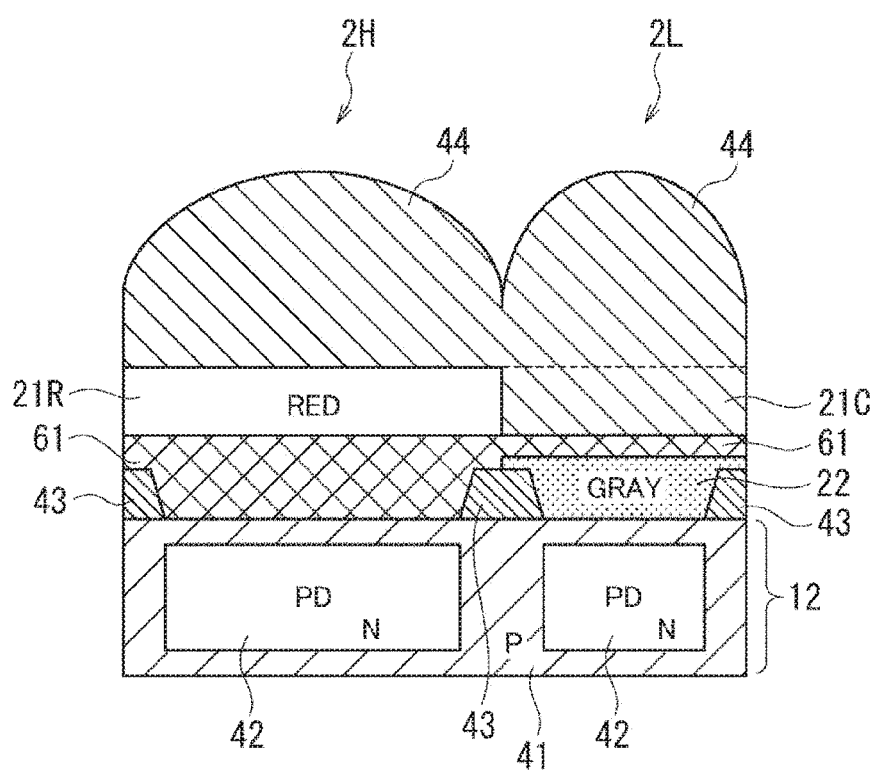
FIG. 16 is a cross-sectional view of a third pixel structure in the third embodiment.

FIG. 16 is a cross-sectional view of a third pixel structure of a high-sensitivity pixel and a low-sensitivity pixel in the third embodiment.

The pixel structure of the high-sensitivity pixel 2H illustrated in FIG. 16 is similar to the pixel structure of the high-sensitivity pixel 2H in the second pixel structure of the third embodiment illustrated in FIG. 15.

On the other hand, in the pixel structure of the low-sensitivity pixel 2L illustrated in FIG. 16, the C color filter 21C in the low-sensitivity pixel 2L of the second pixel structure in the third embodiment illustrated in FIG. 15 includes the same material as that for the on-chip lens 44. The material for the on-chip lens 44 may be, for example, a silicon nitride film (SiN) or a resin material such as styrene resin, acrylic resin, styrene-acryl copolymer resin, or siloxane resin.

In this way, in a case where the C color filter 21C and the on-chip lens 44 are adjacent to each other without any other layer therebetween in the low-sensitivity pixel 2L, the C color filter 21C can include the same material as that for the on-chip lens 44.

5. Fourth Embodiment

Next, a fourth embodiment of high-sensitivity pixels and low-sensitivity pixels will be described. Note that parts of the fourth embodiment different from the first to third embodiments will be described and descriptions of common parts will be omitted as appropriate.

The fourth embodiment is different from the first to third embodiments in array of the color filters 21.

<Array Example of Color Filters>

Figure 17:
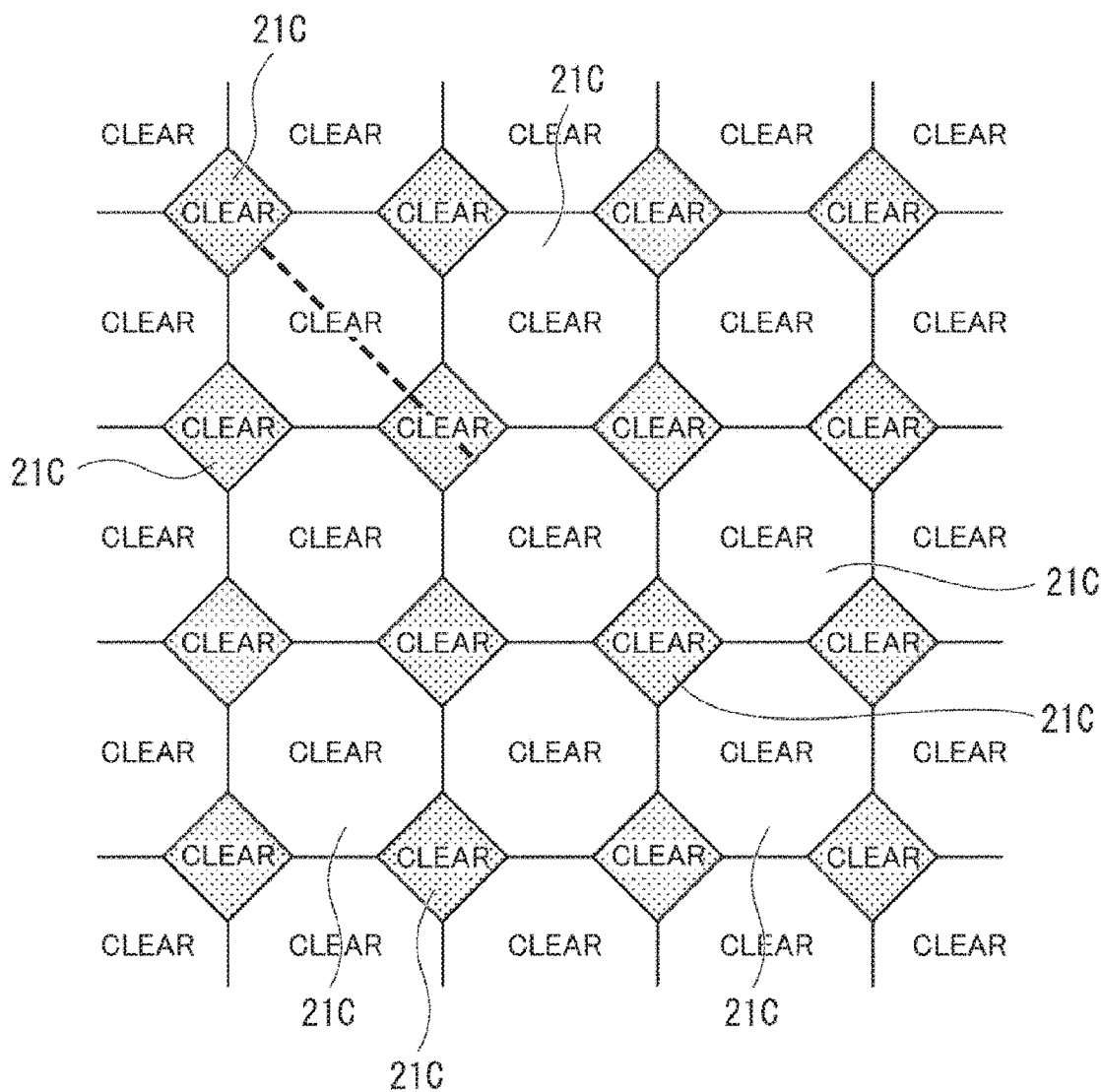
FIG. 17 is a diagram illustrating an array of color filters in a fourth embodiment.

FIG. 17 is a diagram illustrating an array of color filters in the fourth embodiment.

In the fourth embodiment, only the C color filter 21C is arrayed as the color filters 21.

In addition, as in the first embodiment, the gray filter 22 is arranged in the low-sensitivity pixels 2L to decrease the incident light transmission factor by a predetermined ratio.

<Cross-Sectional View of the High-Sensitivity Pixel and the Low-Sensitivity Pixel>

<First Pixel Structure>

Figure 18:
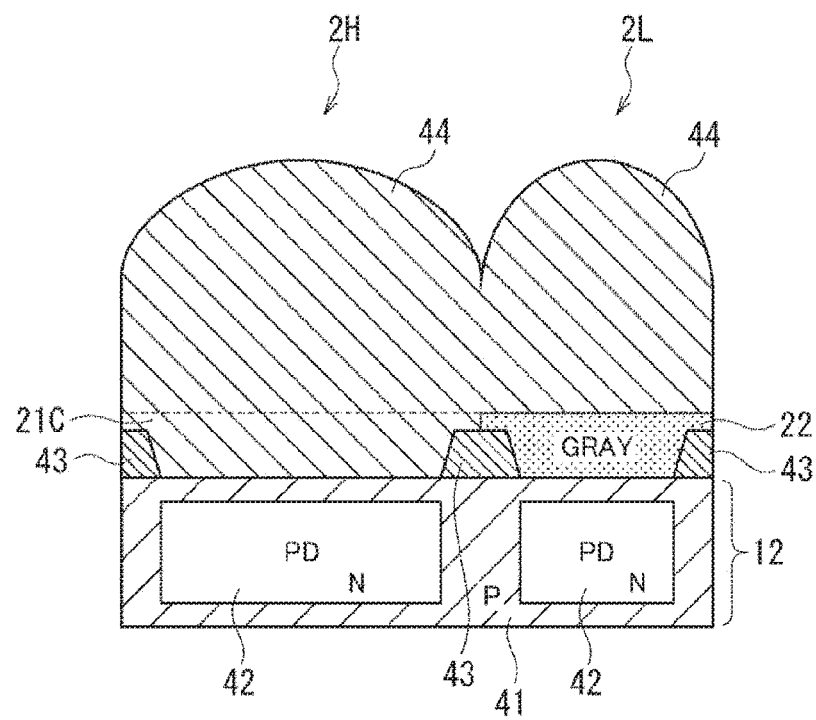
FIG. 18 is a cross-sectional view describing a first pixel structure in the fourth embodiment.

FIG. 18 is a cross-sectional view of a first pixel structure of a high-sensitivity pixel and a low-sensitivity pixel in the fourth embodiment.

The cross-sectional view of FIG. 18 is equivalent to the cross-sectional view of the high-sensitivity pixel 2H and the low-sensitivity pixel 2L indicated by a broken line in FIG. 17, for example.

In a case where the color filters 21 include only the C color filter 21C, the C color filter 21C in the high-sensitivity pixel 2H can integrally include the same material as that for the on-chip lens 44 as illustrated in FIG. 18. Note that as a matter of course, the C color filter 21C may include a material different from that for the on-chip lens 44.

On the other hand, in the low-sensitivity pixel 2L, the gray filter 22 is formed on the back surface of the semiconductor substrate 12 and the on-chip lens 44 is formed on the gray filter 22. In other words, in the low-sensitivity pixel 2L, the gray filter 22 is formed with a predetermined film thickness on the layer equivalent to the C color filter 21C in the high-sensitivity pixel 2H, and the on-chip lens 44 is formed on the gray filter 22.

<Second Pixel Structure>

Figure 19:
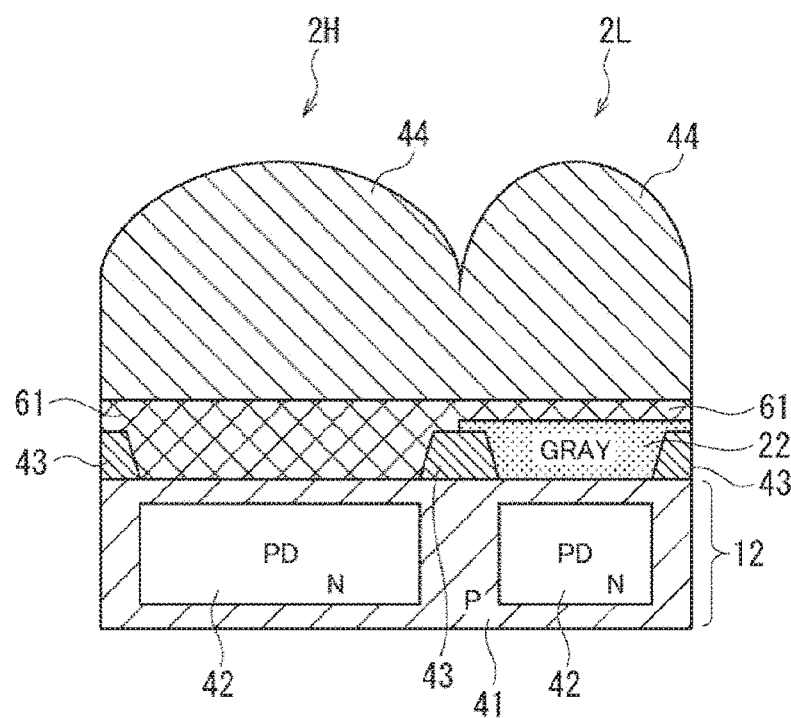
FIG. 19 is a cross-sectional view of a second pixel structure in the fourth embodiment.

FIG. 19 is a cross-sectional view of a second pixel structure of a high-sensitivity pixel and a low-sensitivity pixel in the fourth embodiment.

In the pixel structure of the high-sensitivity pixels 2H and the low-sensitivity pixels 2L in the second pixel structure of the fourth embodiment, the color filter 21 (the R color filter 21R in FIG. 9) in the second modification example of the first embodiment illustrated in FIG. 9 is replaced by the on-chip lens 44.

<Third Pixel Structure>

Figure 20:
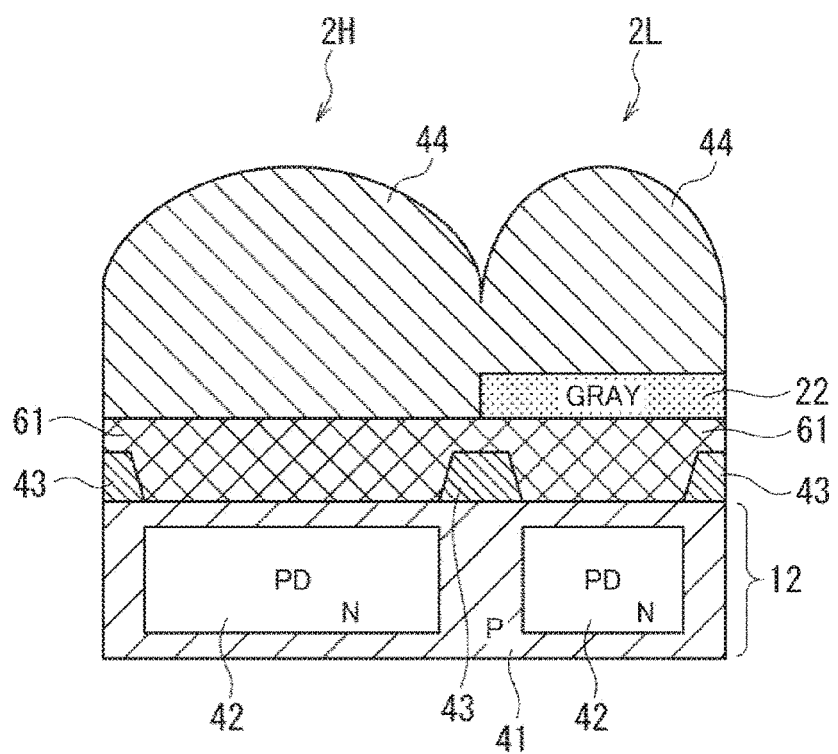
FIG. 20 is a cross-sectional view of a third pixel structure in the fourth embodiment.

FIG. 20 is a cross-sectional view of a third pixel structure of a high-sensitivity pixel and a low-sensitivity pixel in the fourth embodiment.

In the pixel structure of the high-sensitivity pixels 2H and the low-sensitivity pixels 2L in the third pixel structure of the fourth embodiment, as in the first modification example of the first embodiment illustrated in FIG. 8, the flattened film 61 is formed on the inter-pixel light-shielding film 43 and on the semiconductor substrate 12 opened by the inter-pixel light-shielding film 43.

In addition, in the low-sensitivity pixels 2L, the gray filter 22 is formed on the flattened film 61 and the on-chip lens 44 is formed on the gray filter 22. On the other hand, in the high-sensitivity pixels 2H, the on-chip lens 44 is formed directly on the flattened film 61.

In a case where all the pixels in the pixel array portion 3 receive light in the entire visible-light region, in other words, in a case where the solid-state imaging element 1 is an imaging element that generates monochrome images, the first to third pixel structures can be used.

<Summary>

As described above, the solid-state imaging element 1 includes the pixel array portion 3 having the two kinds of pixels 2 different in light-receiving sensitivity, the high-sensitivity pixels 2H and the low-sensitivity pixels 2L, and the low-sensitivity pixels 2L have the gray filter 22 on or under the color filters 21 to decrease light transmission factor in the visible-light region by a predetermined ratio.

The depth-wise structure of the low-sensitivity pixel 2L is different from that of the high-sensitivity pixel 2H only in the addition of the gray filter 22 layer, and the high-sensitivity pixels 2H and the low-sensitivity pixels 2L are the same in array of the color filters 21. This makes it possible to control the transmission factor without changing the wavelength dependency of the transmission factor by the color filters 21. Therefore, it is possible to generate pixel signals with a dynamic range extended by making a difference in light-receiving sensitivity between the low-sensitivity pixels 2L and the high-sensitivity pixels 2H without changing spectral characteristics.

In the foregoing examples, three kinds of arrays of the color filters 21, that is, the Bayer array of R, G, and B illustrated in FIG. 3, the array of R, G, B, and C illustrated in FIG. 12, and the array of R and C illustrated in FIG. 13 are taken as instances, for example. However, the present technology is also applicable to any other arrays of the color filters 21. For example, the present technology is also applicable to arrays including color filters 21 of yellow (Ye), cyan (Cy), and the like.

In addition, as in the fourth embodiment, the present technology is also applicable to the solid-state imaging element 1 that generates monochrome images without the color filters 21. In this case, it can also be regarded that some layers of the on-chip lens 44 correspond to the C color filter 21C or the color filters 21 are omitted.

Besides the difference relating to the gray filter 22, the low-sensitivity pixels 2L and the high-sensitivity pixels 2H are different in pixel size and thus different in planar region (light-receiving area) of the photo diode PD. Alternatively, the low-sensitivity pixels 2L and the high-sensitivity pixels 2H may be of the same structure except for the gray filter 22. In other words, in the each of the foregoing pixel structures, the low-sensitivity pixels 2L and the high-sensitivity pixels 2H may be the same in pixel size. In addition, the pixel shapes of the planar regions of the low-sensitivity pixels 2L and the high-sensitivity pixels 2H are not limited to octagon and square illustrated in FIG. 2.

Alternatively, besides the difference relating to the gray filter 22, the low-sensitivity pixels 2L and the high-sensitivity pixels 2H may be made different in light-receiving sensitivity by a difference in the structure other than the pixel size. For example, the low-sensitivity pixels 2L and the high-sensitivity pixels 2H may be made different in light-receiving sensitivity by changing the opening regions formed by the inter-pixel light-shielding film 43 between the low-sensitivity pixels 2L and the high-sensitivity pixels 2H, or by changing the depth-wise position of the photo diode PD formed in the semiconductor substrate 12 between the low-sensitivity pixels 2L and the high-sensitivity pixels 2H. In addition, two or more of the pixel size, the opening region formed by the inter-pixel light-shielding film 43, and the depth-wise position of the photo diode PD may be different between the low-sensitivity pixels 2L and the high-sensitivity pixels 2H.

The solid-state imaging element 1 has been described so far as an MOS solid-state imaging element of a backside-illuminated type. Alternatively, the solid-state imaging element 1 may be of a front side-illuminated type in which light enters the front surface of the semiconductor substrate 12 on which the pixel transistors are formed.

<6. Examples of Application to Electronic Devices>

The present technology is not limited to application to solid-state imaging elements. Specifically, the present technology is applicable to general electronic devices with a solid-state imaging element used in an image capturing unit (photoelectric conversion unit), including imaging device such as digital still cameras and video cameras, portable terminal devices with an imaging function, photocopiers with a solid-state imaging element used in an image reading unit, and the like. The solid-state imaging element may be formed in one chip or in a module with an imaging function in which an imaging unit and a signal processing unit or an optical system are packaged.

Figure 21:
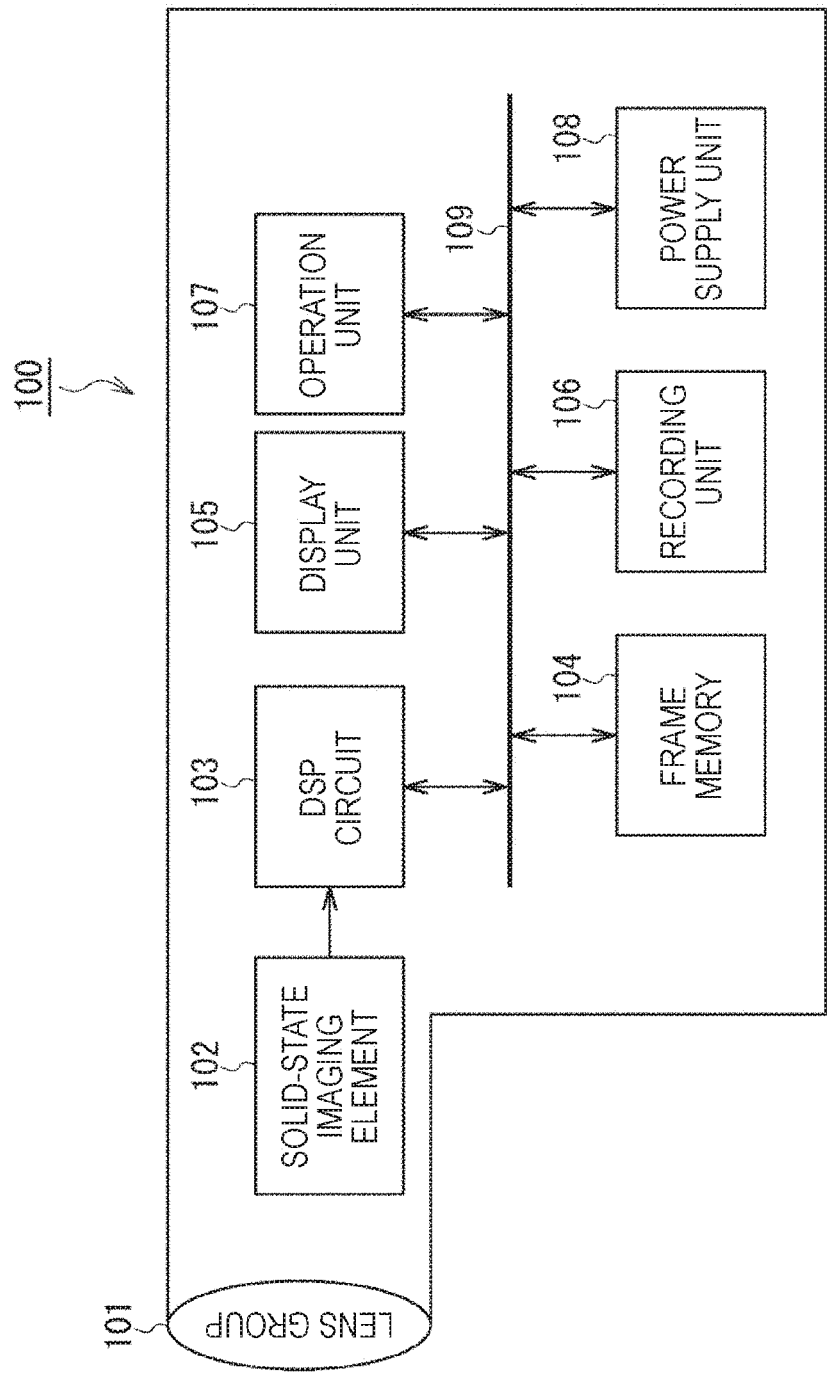
FIG. 21 is a diagram illustrating a configuration example of an imaging device as an electronic device to which the present technology is applied.

FIG. 21 is a diagram illustrating a configuration example of an imaging device as an electronic device to which the present technology is applied.

An imaging device 100 illustrated in FIG. 21 includes an optical unit 101 including a lens group and the like, a solid-state imaging element (imaging device) 102 in which the configuration of the solid-state imaging element 1 illustrated in FIG. 1 is used, and a digital signal processor (DSP) circuit 103 as a camera signal processing circuit. In addition, the imaging device 100 includes a frame memory 104, a display unit 105, a recording unit 106, an operating unit 107, and a power source unit 108. The DSP circuit 103, the frame memory 104, the display unit 105, the recording unit 106, the operating unit 107, and the power source unit 108 are connected to one another via a bus line 109.

The optical unit 101 captures incident light (image light) from a subject and forms an image on an imaging plane of the solid-state imaging element 102. The solid-state imaging element 102 converts the amount of the incident light imaged on the imaging plane by the optical unit 101 into an electrical signal and outputs the same as a pixel signal. The solid-state imaging element 102 may be the solid-state imaging element 1 illustrated in FIG. 1, that is, the pixel array portion 3 that includes the two kinds of pixels 2 different in light-receiving sensitivity, the high-sensitivity pixels 2H and the low-sensitivity pixels 2L, the low-sensitivity pixels 2L having the gray filter 22 to decrease light transmission factor in the visible-light region by a predetermined ratio.

The display unit 105 includes a panel-type display device such as a liquid crystal panel or an organic electro luminescence (EL) panel, for example, which displays moving images or still images captured by the solid-state imaging element 102. The recording unit 106 records moving images or still images captured by the solid-state imaging element 102 on a recording medium such as a hard disc or a semiconductor memory.

The operating unit 107 issues operation orders for various functions of the imaging device 100 in accordance with user operations. The power source unit 108 supplies the DSP circuit 103, the frame memory 104, the display unit 105, the recording unit 106, and the operating unit 107 with various power sources as operating power sources for these components.

As described above, using the solid-state imaging element 1 to which each of the foregoing embodiments is applied as the solid-state imaging element 102 makes it possible to achieve an extended dynamic range by making a difference in light-receiving sensitivity between the low-sensitivity pixels 2L and the high-sensitivity pixels 2H without changing spectral characteristics. Therefore, it is possible to increase the quality of images captured by the imaging device 100 such as video camera, digital still camera, or camera module for mobile device such as cellular phone.

<Usage Examples of an Image Sensor>

Figure 22:
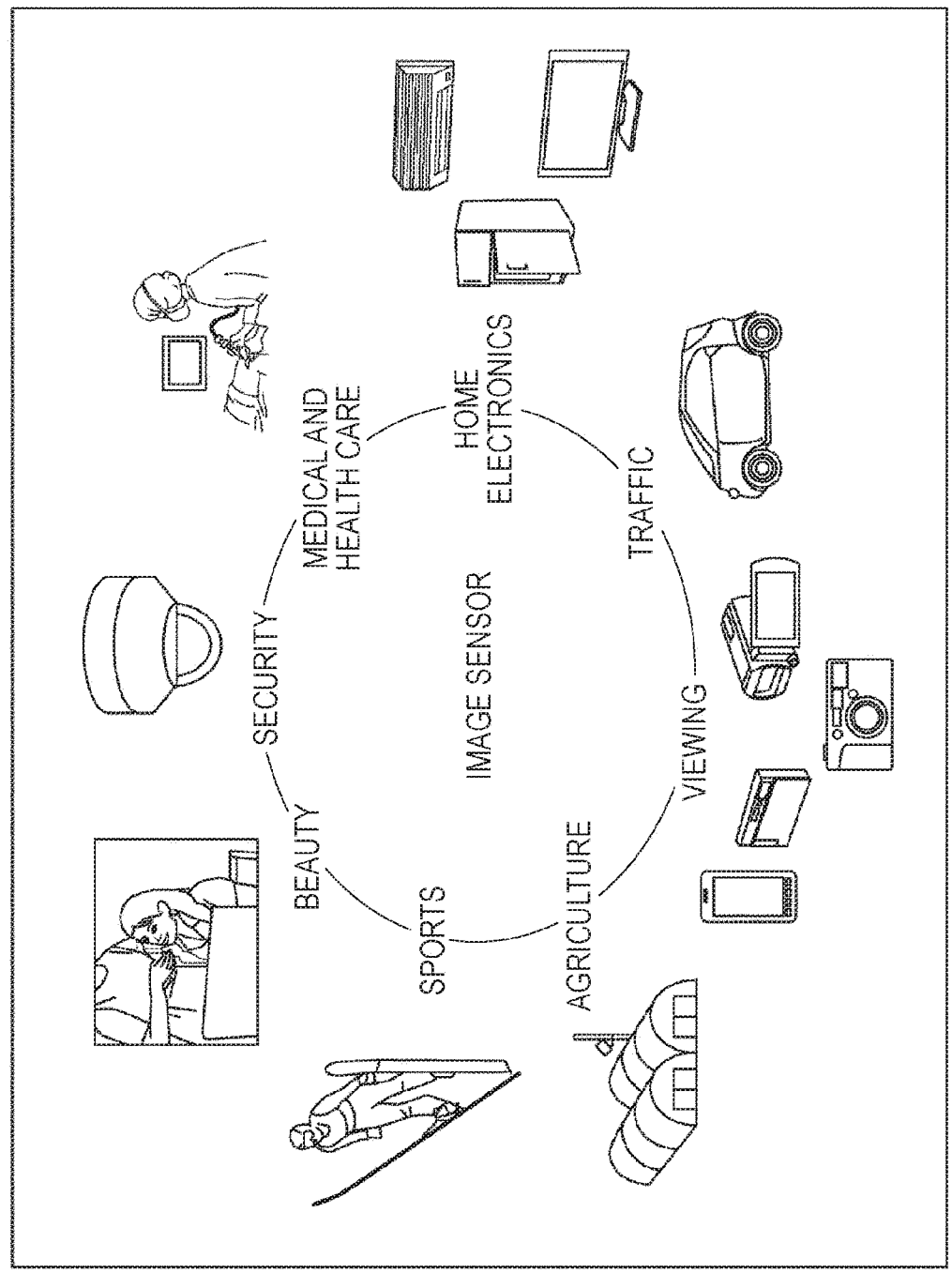
FIG. 22 is a diagram illustrating use examples of the solid-state imaging element illustrated in FIG. 1.

FIG. 22 is a diagram illustrating use examples of an image sensor with the solid-state imaging element 1.

The image sensor with the solid-state imaging element 1 can be used in various cases of sensing visible light, infrared light, ultraviolet light, X rays, and the like, for example, as described below.

- Devices that photograph images for appreciation such as digital cameras and camera-equipped cellular phones
- Devices for traffic applications including, for example, in-vehicle sensors that photograph the areas in front, rear, surroundings, interior, and the like of an automobile for safety running such as automatic stop, recognition of the driver's condition, and the like; monitoring cameras that monitor running vehicles and roads; and distance measurement sensors that measure a vehicle-to-vehicle distance and the like
- Devices for home electric appliances such as TVs, refrigerators, air conditioners that photograph the user's gestures to operate the appliances in accordance with the gestures
- Devices for medical and health care applications such as endoscopes and devices for performing angiography with infrared light
- Devices for security applications such as crime prevention cameras and personal authentication cameras
- Devices for beauty care applications such as skin check machines that photograph persons' skins and microscopes that photograph persons' scalps
- Devices for sporting uses such as action cameras and wearable cameras for sports and the like
- Devices for agricultural applications such as cameras that monitor fields and crops In the foregoing example, the solid-state imaging element has the first conductive type as P type, the second conductive type as N type, and electrons as signal charges. However, the present technology is also applicable to a solid-state imaging element having holes as signal charges. That is, with the first conductive type as N type and the second conductive type as P type, each of the foregoing semiconductor regions can be configured as a reverse conductive-type semiconductor region.

In addition, the present disclosure is applicable to not only solid-state imaging elements that detect the distribution of amount of visible incident light and captures an image of the distribution but also all solid-state imaging elements including solid-state imaging elements that capture an image of the distribution of amount of incident infrared rays, X rays, particles, or the like and solid-state imaging elements in a broad sense (physical amount distribution detection devices) such as fingerprint detection sensors that detect the distribution of other physical amounts such as pressure and electrostatic capacity and capture an image of the distribution.

In addition, the present technology is also applicable to not only solid-state imaging elements but also any other semiconductor devices having semiconductor integrated circuits.

Embodiments of the present technology are not limited to the foregoing embodiments but can be modified in various manners without deviating from the gist of the present technology.

For example, all or some of the foregoing plurality of embodiments may be combined.

Note that the advantageous effects described herein are mere examples but are not limited ones. The present technology may have any advantageous effects other than the ones described herein.

Note that the present technology may be configured as described below.

(1)
A solid-state imaging element including a pixel array portion in which two kinds of pixels different in light-receiving sensitivity, high-sensitivity pixels and low-sensitivity pixels are arrayed, in which
the low-sensitivity pixels have a gray filter on or under a color filter to decrease light transmission factor in a visible-light region by a predetermined ratio.

(2)
The solid-state imaging element according to (1), in which the color filter is at least one of R, G, B, and C color filters.

(3)
The solid-state imaging element according to (2), in which an average transmission factor of the C color filter in wavelengths of 400 to 700 nm is 90% or more.

(4)
The solid-state imaging element according to (2) or (3), in which the C color filter includes the same material as that for an on-chip lens.

(5)
The solid-state imaging element according to any one of (1) to (4), in which an array of the color filters in the two-dimensionally arranged low-sensitivity pixels is the same as an array of the color filters in the two-dimensionally arranged high-sensitivity pixels.

(6)
The solid-state imaging element according to any one of (1) to (5), in which the high-sensitivity pixels and the low-sensitivity pixels are further different in pixel size.

(7)
The solid-state imaging element according to any one of (1) to (6), in which the high-sensitivity pixels and the low-sensitivity pixels are further different in opening region formed by an inter-pixel light-shielding film.

(8)
The solid-state imaging element according to any one of (1) to (7), in which the high-sensitivity pixels and the low-sensitivity pixels are further different in depth-wise position where a photo diode is formed.

(9)
The solid-state imaging element according to any one of (1) to (8), in which light-receiving sensitivity of the low-sensitivity pixels is 50% or less of light-receiving sensitivity of the high-sensitivity pixels.

(10)
The solid-state imaging element according to any one of (1) to (9), in which the gray filter includes a material in which a light-shielding material is dispersed in an organic resin.

(11)
The solid-state imaging element according to (10), in which the light-shielding material is an organic pigment, an inorganic pigment, or carbon black.

(12)
The solid-state imaging element according to any one of (1) to (11), in which the gray filter has an average transmission factor of 10 to 90% in the wavelengths of 400 to 700 nm and the transmission factors in the wavelengths of 400 to 700 nm fall within a range of −15% to +15% of the transmission factor in the wavelength of 550 nm.

(13)
The solid-state imaging element according to any one of (1) to (12), in which a film thickness of the gray filter falls within a range of 100 to 1000 nm.

(14)
The solid-state imaging element according to any one of (1) to (13), in which a predetermined film is inserted into between the gray filter and the color filter.

(15)
The solid-state imaging element according to any one of (1) to (14), in which the gray filter is formed by layering a plurality of kinds of films.

(16)
The solid-state imaging element according to (15), in which one of the plurality of kinds of films is a film including a material in which a light-shielding material is dispersed in an organic resin.

(17)
A manufacturing method of a solid-state imaging element, the method including forming a gray filter on or under a color filter to decrease light transmission factor in a visible-light region by a predetermined ratio for low-sensitivity pixels of the solid-state imaging element including a pixel array portion in which two kinds of pixels different in light-receiving sensitivity, high-sensitivity pixels and the low-sensitivity pixels are arrayed.

(18)
An electronic device including a solid-state imaging element including a pixel array portion in which two kinds of pixels different in light-receiving sensitivity, high-sensitivity pixels and low-sensitivity pixels are arrayed, in which
the low-sensitivity pixels have a gray filter on or under color filters to decrease light transmission factor in a visible-light region by a predetermined ratio.

REFERENCE SIGNS LIST

1 Solid-state imaging element
2 Pixel

2H High-sensitivity pixel
2L Low-sensitivity pixel
3 Pixel array portion
21 Color filter
22 Gray filter
PD Photo diode
43 Inter-pixel light-shielding film
44 On-chip lens
61 Flattened film
71 First film
72 Second film
73 Gray filter
100 Imaging device
102 Solid-state imaging element

The invention claimed is:

1. A solid-state imaging element, comprising:
a pixel array portion that comprises a plurality of low-sensitivity pixels and a plurality of high-sensitivity pixels, wherein
each low-sensitivity pixel of the plurality of low-sensitivity pixels comprises:
a gray filter;
a flattened film; and
a color filter;
the color filter is between the gray filter and the flattened film, and
the gray filter is configured to decrease a light transmission factor in a visible-light region by a ratio.

2. The solid-state imaging element according to claim 1, wherein the color filter is at least one of a Red (R) color filter, a Green (G) color filter, a Blue (B) color filter, and a Clear (C) color filter.

3. The solid-state imaging element according to claim 2, wherein an average transmission factor of the C color filter in wavelengths of 400 nm to 700 nm is one of 90% or more.

4. The solid-state imaging element according to claim 2, further comprising an on-chip lens, wherein the C color filter includes a material same as that for the on-chip lens.

5. The solid-state imaging element according to claim 1, wherein
an array of color filters in the plurality of low-sensitivity pixels is same as an array of color filters in the plurality of high-sensitivity pixels,
the plurality of low-sensitivity pixels is in a two-dimensional arrangement, and
the plurality of high-sensitivity pixels is in a two-dimensional arrangement.

6. The solid-state imaging element according to claim 1, wherein the plurality of high-sensitivity pixels and the plurality of low-sensitivity pixels have different pixel sizes.

7. The solid-state imaging element according to claim 1, wherein
each pixel, of the plurality of low-sensitivity pixels and the plurality of high-sensitivity pixels, comprises an inter-pixel light-shielding film,
the inter-pixel light-shielding film comprises an opening region for each pixel of the plurality of low-sensitivity pixels and the plurality of high-sensitivity pixels, and
the plurality of high-sensitivity pixels and the plurality of low-sensitivity pixels correspond to different opening region sizes.

8. The solid-state imaging element according to claim 1, wherein a first depth-wise position, at which a photo diode is present in a pixel of the plurality of low-sensitivity pixels, is different from a second depth-wise position at which a photo diode is present in a pixel of the plurality of high-sensitivity pixels.

9. The solid-state imaging element according to claim 1, wherein a light-receiving sensitivity of each pixel of the plurality of low-sensitivity pixels is one of 50% or less of a light-receiving sensitivity of each pixel of the plurality of high-sensitivity pixels.

10. The solid-state imaging element according to claim 1, wherein the gray filter includes a material in which a light-shielding material is dispersed in an organic resin.

11. The solid-state imaging element according to claim 10, wherein the light-shielding material is one of an organic pigment, an inorganic pigment, or carbon black.

12. The solid-state imaging element according to claim 1, wherein
the gray filter has an average transmission factor of 10% to 90% in wavelengths of 400 nm to 700 nm,
the light transmission factor, of a plurality of light transmission factors of the gray filter, correspond to a wavelength in the wavelengths of 400 nm to 700 nm, and
the plurality of transmission factors is within a range of −15% to +15% of the transmission factor in a wavelength of 550 nm.

13. The solid-state imaging element according to claim 1, wherein a film thickness of the gray filter is within a range of 100 nm to 1000 nm.

14. The solid-state imaging element according to claim 1, wherein the gray filter comprises layers of a plurality of kinds of films.

15. The solid-state imaging element according to claim 14, wherein one of the plurality of kinds of films is a film including a material in which a light-shielding material is dispersed in an organic resin.

16. A manufacturing method of a solid-state imaging element, the method comprising:
forming a gray filter on a color filter to decrease a light transmission factor in a visible-light region by a ratio for a plurality of low-sensitivity pixels of the solid-state imaging element, wherein
the solid-state imaging element comprises a pixel array portion,
the pixel array portion comprises the plurality of low-sensitivity pixels and a plurality of high-sensitivity pixels,
each low-sensitivity pixel of the plurality of low-sensitivity pixels comprises:
the gray filter;
a flattened film; and
the color filter, and
the color filter is between the gray filter and the flattened film.

17. An electronic device, comprising:
a solid-state imaging element including:
a pixel array portion that comprises a plurality of low-sensitivity pixels and
a plurality of high-sensitivity pixels, wherein
each low-sensitivity pixel of the plurality of low-sensitivity pixels comprises:
a gray filter;
a flattened film; and
a color filter,
the color filter is between the gray filter and the flattened film, and
the gray filter is configured to decrease a light transmission factor in a visible-light region by a ratio.

* * * * *